(12) United States Patent
Lee et al.

(10) Patent No.: US 11,804,419 B2
(45) Date of Patent: Oct. 31, 2023

(54) SEMICONDUCTOR DEVICE

(71) Applicant: Samsung Electronics Co., Ltd., Suwon-si (KR)

(72) Inventors: Hakseung Lee, Seoul (KR); Kwangjin Moon, Hwaseong-si (KR); Hyungjun Jeon, Seoul (KR); Hyoukyung Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 297 days.

(21) Appl. No.: 17/185,166

(22) Filed: Feb. 25, 2021

(65) Prior Publication Data

US 2022/0037235 A1 Feb. 3, 2022

(30) Foreign Application Priority Data

Jul. 31, 2020 (KR) ........................ 10-2020-0096139

(51) Int. Cl.
| | | |
|---|---|---|
| *H01L 23/48* | (2006.01) | |
| *H01L 23/522* | (2006.01) | |
| *H01L 23/00* | (2006.01) | |
| *H01L 23/528* | (2006.01) | |
| *H01L 25/065* | (2023.01) | |

(52) U.S. Cl.
CPC ........ *H01L 23/481* (2013.01); *H01L 23/5226* (2013.01); *H01L 23/5283* (2013.01); *H01L 24/08* (2013.01); *H01L 25/0652* (2013.01); *H01L 2224/08146* (2013.01)

(58) Field of Classification Search
CPC .............. H01L 23/481; H01L 23/5226; H01L 23/5283; H01L 25/0657; H01L 21/76898; H01L 24/08
See application file for complete search history.

(56) References Cited

U.S. PATENT DOCUMENTS

| | | | |
|---|---|---|---|
| 5,489,554 A * | 2/1996 | Gates ................ | H01L 21/76898 438/455 |
| 8,164,165 B2 | 4/2012 | Chang et al. | |
| 8,338,939 B2 | 12/2012 | Lin et al. | |
| 8,487,444 B2 | 7/2013 | Law et al. | |
| 8,916,471 B1 | 12/2014 | Yang et al. | |
| 9,048,151 B2 * | 6/2015 | Chen .................. | H01L 27/0688 |
| 9,093,348 B2 | 7/2015 | Mitsuhashi | |
| 9,293,366 B2 | 3/2016 | Lin et al. | |

(Continued)

*Primary Examiner* — Jaehwan Oh
*Assistant Examiner* — John M Parker
(74) *Attorney, Agent, or Firm* — HARNESS, DICKEY & PIERCE, P.L.C.

(57) ABSTRACT

A semiconductor device may include a substrate including a first surface and a second surface, which are opposite to each other, an insulating layer on the first surface of the substrate, a first via structure and a second via structure penetrating the substrate and a portion of the insulating layer and having different widths from each other in a direction parallel to the first surface of the substrate, metal lines provided in the insulating layer, and an integrated circuit provided on the first surface of the substrate. A bottom surface of the first via structure may be located at a level lower than a bottom surface of the second via structure, when measured from the first surface of the substrate. The second via structure may be electrically connected to the integrated circuit through the metal lines.

20 Claims, 14 Drawing Sheets

(56) References Cited

U.S. PATENT DOCUMENTS

| | | |
|---|---|---|
| 9,293,418 B2 | 3/2016 | Wu et al. |
| 9,299,640 B2 | 3/2016 | Lin |
| 9,343,390 B2 | 5/2016 | Lin et al. |
| 9,691,684 B2 | 6/2017 | Park et al. |
| 2011/0057321 A1* | 3/2011 | Wang .................. H01L 24/80 |
| | | 257/E21.597 |
| 2017/0317011 A1* | 11/2017 | Lin ................ H01L 21/76816 |
| 2021/0043547 A1* | 2/2021 | Lin ...................... H01L 25/50 |
| 2021/0391237 A1* | 12/2021 | Kao ................ H01L 21/76898 |
| 2022/0230939 A1* | 7/2022 | Shih .................. H01L 23/481 |

* cited by examiner

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2020-0096139, filed on Jul. 31, 2020, in the Korean Intellectual Property Office, the entire contents of which are hereby incorporated by reference.

BACKGROUND

Example embodiments of the present disclosure relate to a semiconductor device. For example, at least some example embodiments relate to a semiconductor device including a via structure.

A semiconductor device may be electrically connected to another semiconductor device or a printed circuit board through a through via. The through via may be used for a three-dimensional packaging to realize a fast transmission speed, compared to a conventional structure with solder balls or solder bumps. As an integration density of a semiconductor device increases, it may be desirable to develop a through via with improved physical and electrical reliability.

SUMMARY

An example embodiment of the inventive concepts provide a semiconductor device with improved electric characteristics.

According to an example embodiment of the inventive concepts, a semiconductor device may include a substrate including a first surface and a second surface opposite the first surface; an insulating layer on the first surface of the substrate; a first via structure and a second via structure each penetrating the substrate and a portion of the insulating layer, the second via structure having a different width from the first via structure in a direction parallel to the first surface of the substrate with a bottom surface of the first via structure being at a level lower than a bottom surface of the second via structure, when measured from the first surface of the substrate; metal lines in the insulating layer; and an integrated circuit on the first surface of the substrate, the integrated circuit being electrically connected to the second via structure through the metal lines.

According to an example embodiment of the inventive concepts, a semiconductor device may include a substrate including a first surface and a second surface opposite the first surface; an insulating layer on the first surface of the substrate; a first via structure and a second via structure each penetrating the substrate and a portion of the insulating layer, the first via structure and the second via structure each including an insulating pattern, a barrier pattern on the insulating pattern, and a via on the barrier pattern, a bottom surface of the first via structure being at a level lower than a bottom surface of the second via structure, when measured from the first surface of the substrate; and a plurality of lower pads configured to contact the bottom surface of respective ones of the first via structure and the second via structure such that the barrier pattern is interposed between a bottom surface of the via in each of the first via structure and the second via structure and a corresponding one of the plurality of lower pads, wherein a smallest width of the first via structure in a direction parallel to the first surface of the substrate is larger than that of the second via structure.

According to an example embodiment of the inventive concepts, a semiconductor device may include a substrate including a first surface and a second surface opposite the first surface; an insulating layer on the first surface of the substrate; a first upper pad and a second upper pad on the second surface of the substrate with the first upper pad spaced apart from the second upper pad in a direction parallel to the first surface of the substrate; and a first via structure and a second via structure each penetrating the substrate and a portion of the insulating layer, the second via structure having a different width from the first via structure in a direction parallel to the first surface of the substrate with a bottom surface of the first via structure being at a different level from a bottom surface of the second via structure, when measured from the first surface of the substrate, the first via structure and the second via structure being electrically connected to the first upper pad and the second upper pad, respectively.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Example embodiments of the inventive concepts will now be described more fully with reference to the accompanying drawings, in which example embodiments are shown.

Figure 1:
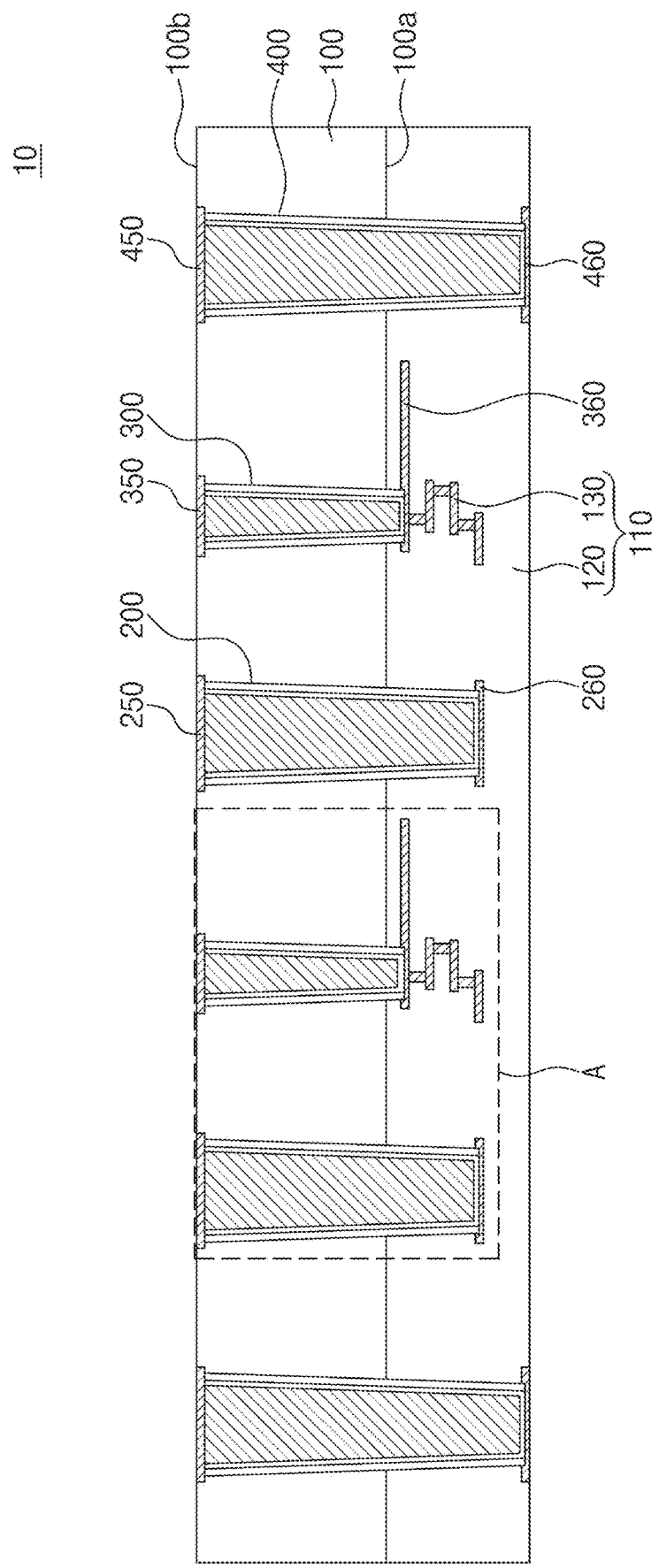
FIG. 1 is a sectional view illustrating a semiconductor device according to an example embodiment of the inventive concepts.

FIG. 1 is a sectional view illustrating a semiconductor device according to an example embodiment of the inventive concepts.

Referring to FIG. 1, a semiconductor device 10 may include a substrate 100, a circuit layer 110, a first via structure 200, a second via structure 300, and a third via structure 400. The semiconductor device 10 may be a semiconductor chip. For example, the semiconductor device 10 may be a logic chip, a sensing chip, or a memory chip. The memory chip may be or include at least one of dynamic random-access memory (DRAM), static random-access memory (SRAM), magnetic random-access memory (MRAM), or FLASH memory chips. The substrate 100 may be a semiconductor substrate. The substrate 100 may be a wafer-level substrate or a chip-level substrate. For example, the substrate 100 may be a silicon substrate, a germanium substrate, or a silicon-germanium substrate. The substrate 100 may include a first surface 100a and a second surface 100b, which are opposite to each other. The first surface 100a of the substrate 100 may be a front or top surface, and the second surface 100b of the substrate 100 may be a rear or bottom surface. The first surface 100a may be parallel to the second surface 100b.

The circuit layer 110 may be provided on the first surface 100a of the substrate 100. The circuit layer 110 may include an insulating layer 120 and metal lines 130. The insulating layer 120 may be formed of or include at least one of oxide materials. For example, the insulating layer 120 may be formed of or include at least one of silicon oxide, silicon oxynitride, or silicon oxycarbide. The metal lines 130 may be provided in the insulating layer 120. The metal lines 130 may be formed of or include at least one of conductive metals. For example, the metal lines 130 may be formed of or include at least one of metallic materials (e.g., copper (Cu), aluminum (Al), tungsten (W), and titanium (Ti)).

The first via structure 200 and the second via structure 300 may be provided in the substrate 100 to penetrate the substrate 100 and a portion of the circuit layer 110. In other words, the first via structure 200 and the second via structure 300 may be provided in a single semiconductor device 10. The third via structure 400 may be provided in the substrate 100 to penetrate the circuit layer 110 and the substrate 100. In the present specification, the via structure may mean a through via or a through-silicon via. Each of the first, second, and third via structures 200, 300, and 400 may be a conductive through via structure. A first upper pad 250 may be provided on the topmost surface of the first via structure 200, and a first lower pad 260 may be provided on the bottommost surface of the first via structure 200. A second upper pad 350 may be provided on the topmost surface of the second via structure 300, and a second lower pad 360 may be provided on the bottommost surface of the second via structure 300. A third upper pad 450 may be provided on the topmost surface of the third via structure 400, and a third lower pad 460 may be provided on the bottommost surface of the third via structure 400. The first, second, and third upper pads 250, 350, and 450 and the first, second, and third lower pads 260, 360, and 460 may be formed of or include at least one of conductive metals and may be formed of or include at least one of metallic materials (e.g., copper (Cu), aluminum (Al), tungsten (W), and titanium (Ti)). The third via structure 400 may be provided such that the smallest width thereof is equal to or larger than the smallest width of the first via structure 200. In the present specification, the width of an element is a width of the element measured in a direction parallel to the first surface 100a of the substrate 100.

Figure 2:
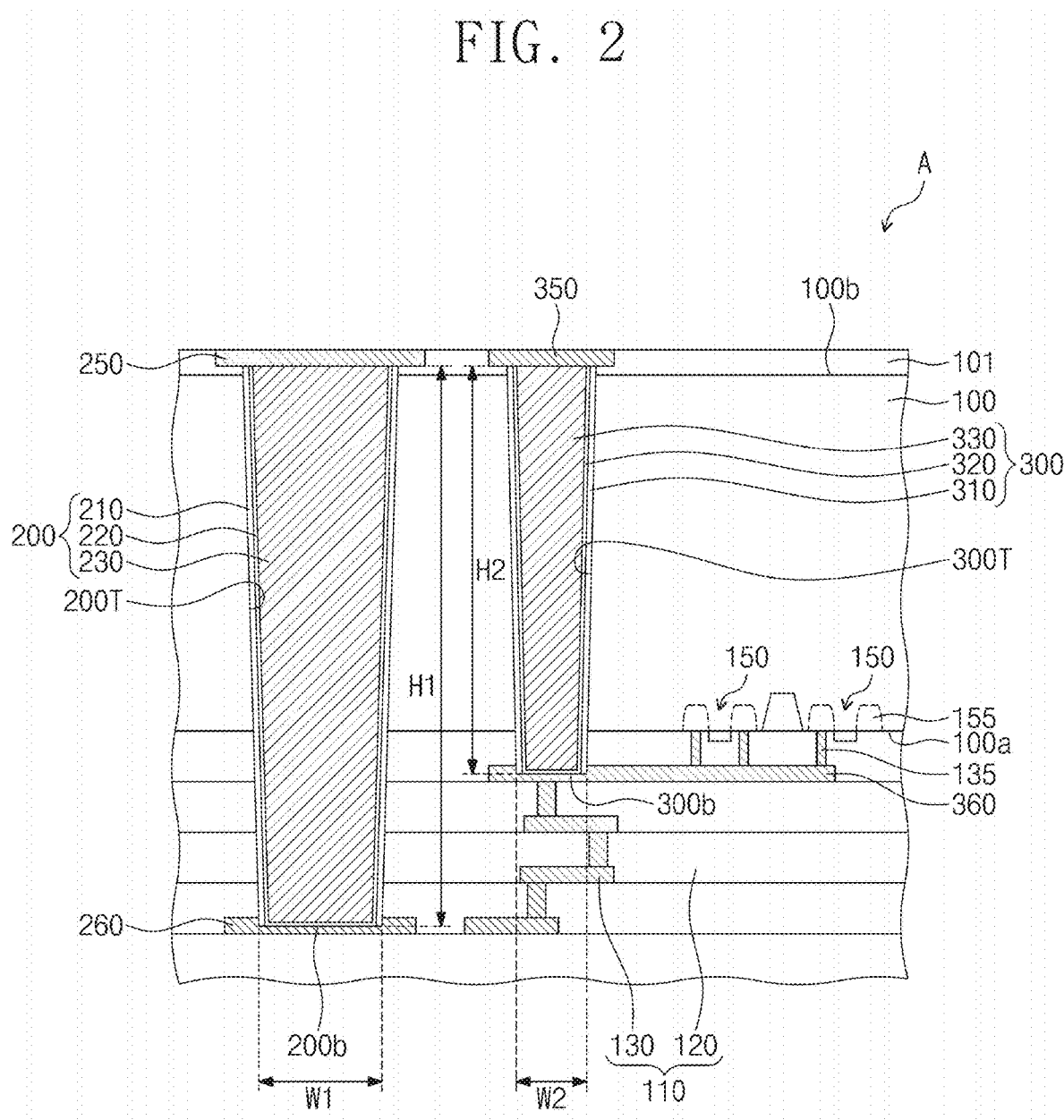
FIG. 2 is an enlarged sectional view illustrating a portion of a semiconductor device (e.g., a portion A of FIG. 1) according to an example embodiment of the inventive concepts.

FIG. 2 is an enlarged sectional view illustrating a portion of a semiconductor device (e.g., a portion A of FIG. 1) according to an example embodiment of the inventive concepts.

Referring to FIGS. 1 and 2, an upper insulating pattern 101 may be provided on the second surface 100b of the substrate 100. The upper insulating pattern 101 may be formed of or include at least one of insulating materials. For example, the upper insulating pattern 101 may be formed of or include at least one of silicon oxide, silicon nitride, silicon oxynitride, silicon oxycarbide, or silicon carbonitride.

Integrated circuits 150 may be provided on the first surface 100a of the substrate 100. In an example embodiment, the integrated circuits 150 may include parts formed in the circuit layer 110. For example, the integrated circuits 150 may be active devices (e.g., diode, transistor, and so forth), passive devices (e.g., capacitor and so forth), or photoelectric conversion devices. The integrated circuits 150 may include a doped region 155. For example, the doped region 155 may be used as one of source/drain electrodes of the transistor. The integrated circuits 150 may be electrically connected to the second lower pad 360 through circuit lines 135. In the present specification, the expression "two elements are electrically connected/coupled to each other" may mean that the elements are directly connected/coupled to each other or are indirectly connected/coupled to each other through another conductive element.

The insulating layer 120 may include a plurality of stacked insulating layers 120. The insulating layer 120 may be provided to cover the integrated circuits 150, the metal lines 130, the first lower pad 260, and the second lower pad 360.

The first upper pad 250 and the second upper pad 350 may be provided on the second surface 100b of the substrate 100 and may be spaced apart from each other in a direction parallel to the first surface 100a of the substrate 100. The first upper pad 250 and the second upper pad 350 may not be connected to each other. In other words, the first upper pad 250 and the second upper pad 350 may be used as independent elements.

The first via structure 200 may be provided in the substrate 100 to penetrate the substrate 100 and a portion of the insulating layer 120. The first via structure 200 may include a first insulating pattern 210, a first barrier pattern 220, and a first via 230. The first insulating pattern 210 may be provided on an inner side surface of a first via hole 200T. The first insulating pattern 210 may be formed to conformally cover the inner side surface of the first via hole 200T. The first insulating pattern 210 may be interposed between the substrate 100 and an outer side surface of the first barrier pattern 220 and between the insulating layer 120 and the outer side surface of the first barrier pattern 220. For example, the first insulating pattern 210 may be formed of or include at least one of silicon oxide, silicon nitride, or silicon oxynitride. The first barrier pattern 220 may be provided on an inner side surface of the first insulating pattern 210 and a bottom surface of the first via hole 200T. The first barrier pattern 220 may be formed to conformally cover the inner side surface of the first insulating pattern 210 and the bottom surface of the first via hole 200T. The first barrier pattern 220 may be interposed between the inner side surface of the first insulating pattern 210 and an outer side surface of the first via 230 and may be extended into a region between the first lower pad 260 and a bottom surface of the first via 230. The first barrier pattern 220 may be formed of or include at least one of conductive metals or conductive metal nitrides. For example, the first barrier pattern 220 may be formed of or include at least one of titanium (Ti), titanium nitride (TiN), tantalum (Ta), tantalum nitride (TaN), tungsten (W), or tungsten nitride (WN). The first via 230 may be provided on the first barrier pattern 220. The first via 230 may be provided to fill a remaining portion of the first via hole 200T. The first via 230 may be formed of or include at least one of conductive metals. For example, the first via 230 may be formed of or include at least one of metallic materials (e.g., copper (Cu), aluminum (Al), tungsten (W), and titanium (Ti)). The topmost surface of the first via 230 may be located at the same level as the topmost surface of the first insulating pattern 210 and the topmost surface of the first barrier pattern 220. A width of the uppermost portion of the first via structure 200 may be larger than a width of the lowermost portion of the first via structure 200.

The first via structure 200 may be provided to expose a portion of a top surface of the first lower pad 260. The first via structure 200 may connect the first upper pad 250 on a top surface of the first via structure 200 electrically to the first lower pad 260 on a bottom surface of the first via structure 200. The first upper pad 250 or the first lower pad 260 may be a pad, which is used to provide a power voltage from the outside to the semiconductor device 10. For example, the first upper pad 250 or the first lower pad 260 may be a power pad. The first via structure 200 may be a via structure, which is used to provide the power voltage to the semiconductor device 10. For example, the first via structure 200 may be a power via structure.

The second via structure 300 may be provided in the substrate 100 to penetrate the substrate 100 and a portion of the insulating layer 120. The second via structure 300 may include a second insulating pattern 310, a second barrier pattern 320, and a second via 330. The second insulating pattern 310 may be provided on an inner side surface of a second via hole 300T. The second insulating pattern 310 may be formed to conformally cover the inner side surface of the second via hole 300T. The second insulating pattern 310 may be interposed between the substrate 100 and an outer side surface of the second barrier pattern 320 and between the insulating layer 120 and the outer side surface of the second barrier pattern 320. For example, the second insulating pattern 310 may be formed of or include at least one of silicon oxide, silicon nitride, or silicon oxynitride. The second barrier pattern 320 may be provided on an inner side surface of the second insulating pattern 310 and a bottom surface of the second via hole 300T. The second barrier pattern 320 may be formed to conformally cover the inner side surface of the second insulating pattern 310 and the bottom surface of the second via hole 300T. The second barrier pattern 320 may be interposed between the inner side surface of the second insulating pattern 310 and an outer side surface of the second via 330 and may be extended into a region between the second lower pad 360 and a bottom surface of the second via 330. The second barrier pattern 320 may be formed of or include at least one of conductive metals or conductive metal nitrides. For example, the second barrier pattern 320 may be formed of or include at least one of titanium (Ti), titanium nitride (TiN), tantalum (Ta), tantalum nitride (TaN), tungsten (W), or tungsten nitride (WN). The second via 330 may be provided on the second barrier pattern 320. The second via 330 may be provided to fill a remaining portion of the second via hole 300T. The second via 330 may be formed of or include at least one of conductive metals. For example, the second via 330 may be formed of or include at least one of metallic materials (e.g., copper (Cu), aluminum (Al), tungsten (W), and titanium (Ti)). The topmost surface of the second via 330 may be located at the same level as the topmost surface of the second insulating pattern 310 and the topmost surface of the second barrier pattern 320. A width of the uppermost portion of the second via structure 300 may be larger than a width of the lowermost portion of the second via structure 300.

The second via structure 300 may be provided to expose a portion of a top surface of the second lower pad 360. The second via structure 300 may connect the second upper pad 350 on a top surface of the second via structure 300 electrically to the second lower pad 360 on a bottom surface of the second via structure 300. The second upper pad 350 or the second lower pad 360 may be a pad, which is used to input and/or output an electrical signal. For example, the second upper pad 350 or the second lower pad 360 may be a signal pad. The second via structure 300 may be a via structure, which is used to input and/or output an electrical signal. For example, the second via structure 300 may be a signal via structure.

The second via structure 300 may be provided adjacent to the integrated circuits 150. In other words, when measured in a direction parallel to the first surface 100a of the substrate 100, a distance between the second via structure 300 and the integrated circuits 150 may be smaller than a distance between the first via structure 200 and the integrated circuits 150. The second via structure 300 and the integrated circuits 150 may be electrically connected to each other through the second lower pad 360 and the circuit lines 135.

The first via structure 200 and the second via structure 300 may have different widths from each other. When measured in a direction parallel to the first surface 100a of the substrate 100, the smallest width W1 of the first via structure 200 may be larger than the smallest width W2 of the second via structure 300. The smallest width W1 of the first via structure 200 may be 1.1 to 2 times the smallest width W2 of the second via structure 300. For example, the smallest width W1 of the first via structure 200 may range from 0.2 μm to 10 μm. For example, the smallest width W2 of the second via structure 300 may range from 0.1 μm to 5 μm.

The top surface of the first via structure 200 may be located at the same level as the top surface of the second via structure 300. A bottom surface 200b of the first via structure 200 and the bottom surface 300b of the second via structure 300 may be located at a level higher than a bottom surface of the circuit layer 110, when measured from the first surface 100a of the substrate 100. The bottom surface 200b of the first via structure 200 may be located at a level lower than the bottom surface 300b of the second via structure 300, when measured from the first surface 100a of the substrate 100. For example, a vertical distance between the bottom surface 200b of the first via structure 200 and the bottom surface 300b of the second via structure 300 may range from 0.1 μm to 10 μm.

Each of the first and second via structures 200 and 300 may have a height in a direction perpendicular to the top surface of the substrate 100 (e.g., the first surface 100a). A height H1 of the first via structure 200 may be larger than a height H2 of the second via structure 300. For example, the height H2 of the second via structure 300 may be 80% to 99% of the height H1 of the first via structure 200.

In general, to increase an integration density of a semiconductor device, a width of via is decreased, but in this case, an electric resistance of the via is increased. In some embodiments of the inventive concepts, in order to allow each of the first and second via structures 200 and 300 to have its desired (or, alternatively, optimized) property, the first and second via structures 200 and 300 may be formed to have widths and heights different from each other. For example, it may be preferable that the signal via structure (e.g., the second via structure 300) is relatively insensitive to a variation of contact resistance and that the power via structure (e.g., the first via structure 200) has low contact resistance. According to an example embodiment of the inventive concepts, since the smallest width W1 of the first via structure 200 and the height H1 is larger than the smallest width W2 of the second via structure 300 and the height H2 and the first and second via structures 200 and 300 have bottom surfaces located at different levels, it may be possible to reduce the electric resistance of the first via structure 200. As a result, the electrical resistance of the semiconductor device may be reduced. In addition, since the second via structure 300, which is disposed adjacent to the integrated circuits 150, is provided to have a reduced width, it may be possible to prevent the integrated circuits 150 from being damaged and thereby to improve a keep-out zone (KOZ) property. That is, it may be possible to realize a desired (or, alternatively, optimized) property of each via and to improve electric characteristics of a semiconductor device.

Figure 3:
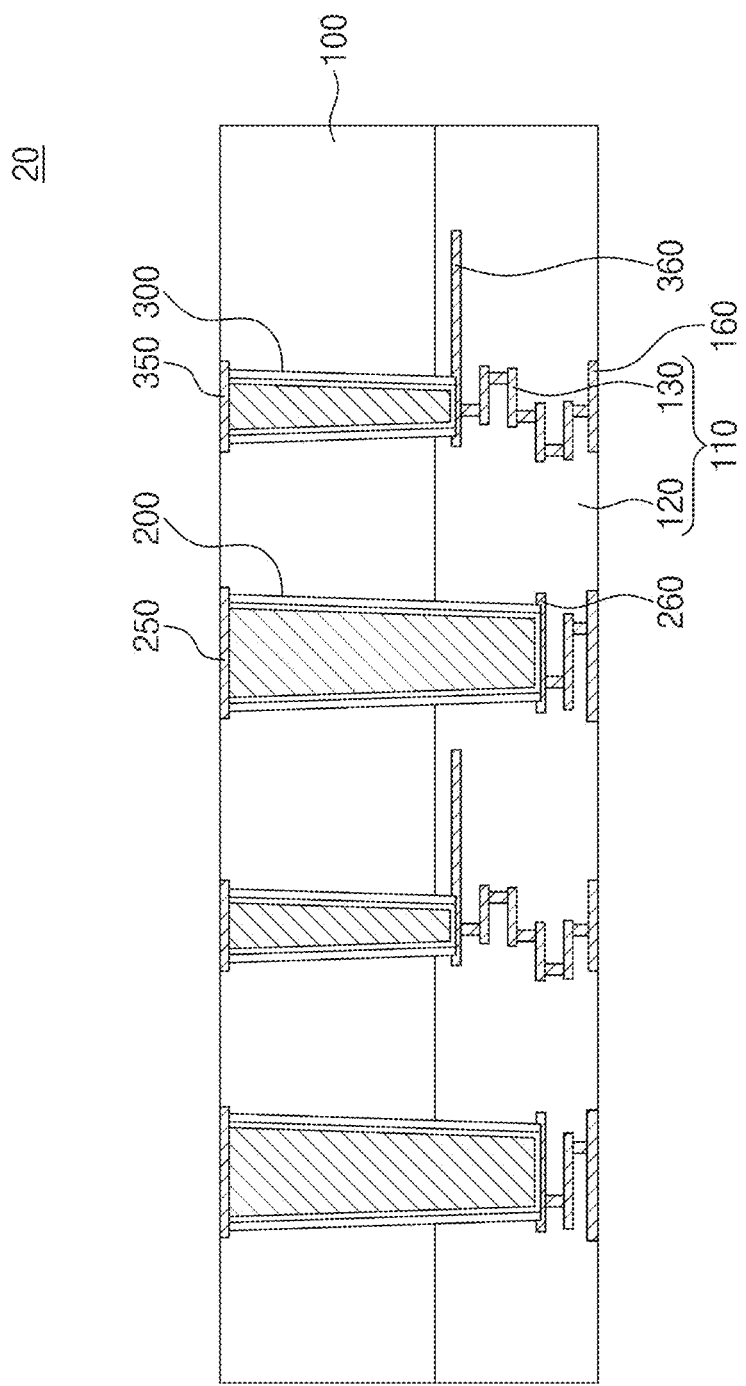
FIG. 3 is a sectional view illustrating a semiconductor device according to an example embodiment of the inventive concepts.

FIG. 3 is a sectional view illustrating a semiconductor device according to an example embodiment of the inventive concepts. In the following description, a previously described element may be identified by the same reference number without repeating an overlapping description thereof, for the sake of brevity.

Referring to FIG. 3, a semiconductor device 20 may include the substrate 100, the circuit layer 110, the first via structure 200, the second via structure 300, and chip pads 160. Each of the first via structure 200 and the second via structure 300 may be electrically connected to the chip pads 160 through the metal lines 130. Each of the first via structure 200 and the second via structure 300 may be electrically connected to an external semiconductor device (not shown) through the chip pads 160.

The semiconductor device 20 may not include the third via structure 400, unlike the embodiment of FIG. 1. Except for the structure, in which the chip pads 160, instead of the third via structure 400, are provided, the semiconductor device in the present embodiment may be substantially the same as that described with reference to FIG. 1.

Figure 4:
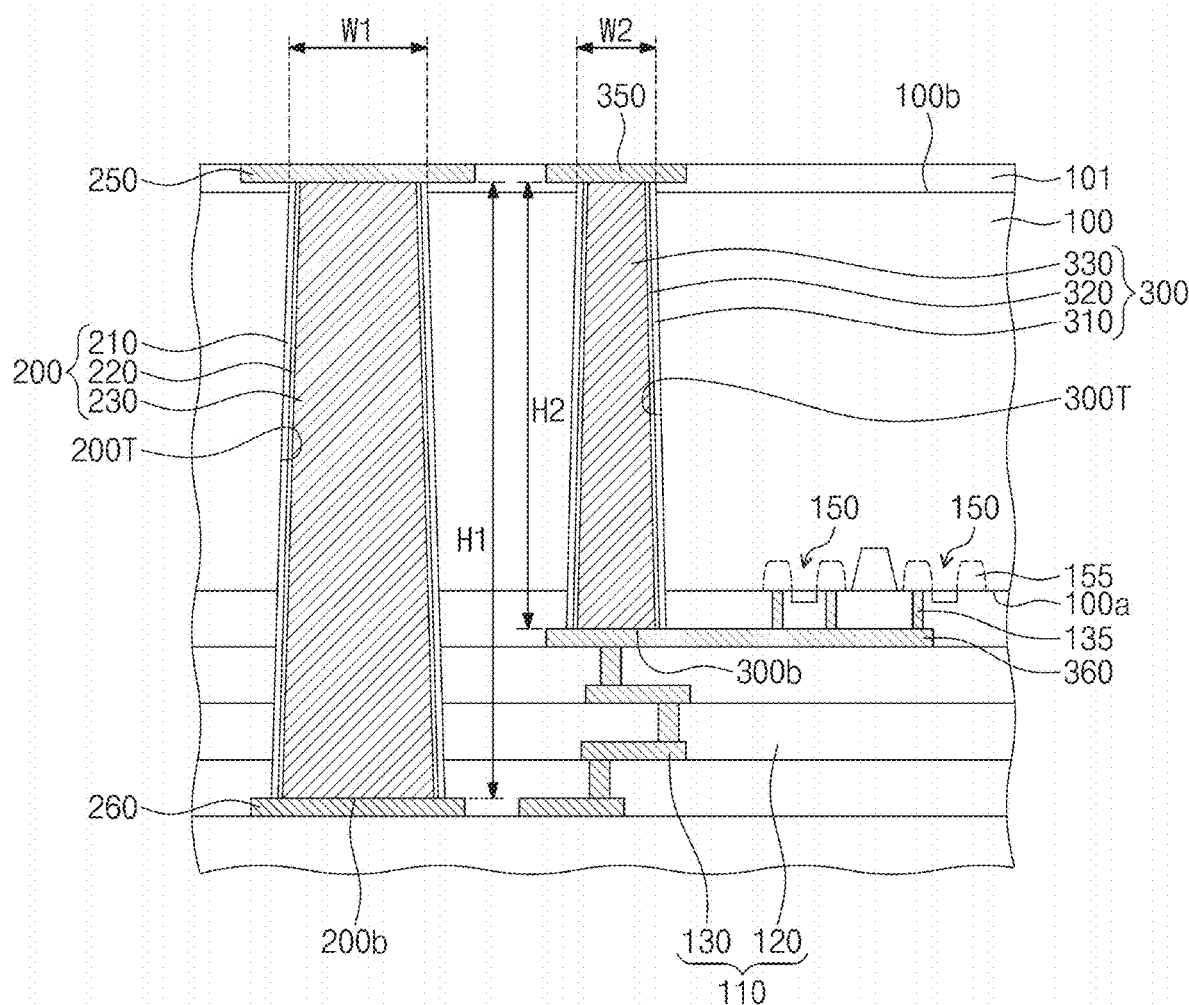
FIG. 4 is a sectional view illustrating a portion of a semiconductor device according to an example embodiment of the inventive concepts.

FIG. 4 is a sectional view illustrating a portion of a semiconductor device according to an example embodiment of the inventive concepts. In the following description, a previously described element may be identified by the same reference number without repeating an overlapping description thereof, for the sake of brevity.

Referring to FIG. 4, the first via structure 200 may be formed in the substrate 100 to penetrate the substrate 100 and a portion of the insulating layer 120. The first insulating pattern 210 may be conformally provided on the inner side surface of the first via hole 200T. The first insulating pattern 210 may be interposed between the substrate 100 and the outer side surface of the first barrier pattern 220 and between the insulating layer 120 and the outer side surface of the first barrier pattern 220. The first barrier pattern 220 may be conformally provided on the inner side surface of the first insulating pattern 210. The first barrier pattern 220 may be interposed between the inner side surface of the first insulating pattern 210 and the outer side surface of the first via 230. The first via 230 may be provided on an inner side surface of the first barrier pattern 220 and the first lower pad 260. The first via 230 may fill a remaining portion of the first via hole 200T. The topmost surface of the first via 230 may be located at the same level as the topmost surface of the first insulating pattern 210 and the topmost surface of the first barrier pattern 220. A width of the uppermost portion of the first via structure 200 may be smaller than a width of the lowermost portion of the first via structure 200.

The second via structure 300 may be formed in the substrate 100 to penetrate the substrate 100 and a portion of the insulating layer 120. The second insulating pattern 310 may be conformally provided on the inner side surface of the second via hole 300T. The second insulating pattern 310 may be interposed between the substrate 100 and the outer side surface of the second barrier pattern 320 and between the insulating layer 120 and the outer side surface of the second barrier pattern 320. The second barrier pattern 320 may be conformally provided on the inner side surface of the second insulating pattern 310. The second barrier pattern 320 may be interposed between the inner side surface of the second insulating pattern 310 and the outer side surface of the second via 330. The second via 330 may be provided on an inner side surface of the second barrier pattern 320 and the second lower pad 360. The second via 330 may fill a remaining portion of the second via hole 300T. The topmost surface of the second via 330 may be located at the same level as the topmost surface of the second insulating pattern 310 and the topmost surface of the second barrier pattern 320. A width of the uppermost portion of the second via structure 300 may be smaller than a width of the lowermost portion of the second via structure 300.

The first via structure 200 and the second via structure 300 may have different widths from each other. The smallest width W1 of the first via structure 200 may be larger than the smallest width W2 of the second via structure 300. For example, the smallest width W1 of the first via structure 200 may range from 0.2 μm to 10 μm. For example, the smallest width W1 of the first via structure 200 may range from 0.2 μm to 10 μm. For example, the smallest width W2 of the second via structure 300 may range from 0.1 μm to 5 μm.

The top surface of the first via structure 200 may be located at the same level as the top surface of the second via structure 300. The bottom surface 200b of the first via structure 200 and the bottom surface 300b of the second via structure 300 may be located at a level higher than the bottom surface of the circuit layer 110, when measured from the first surface 100a of the substrate 100. The bottom surface 200b of the first via structure 200 may be located at a level lower than the bottom surface 300b of the second via structure 300, when measured from the first surface 100a of the substrate 100. For example, a vertical distance between the bottom surface 200b of the first via structure 200 and the bottom surface 300b of the second via structure 300 may range from 0.1 μm to 10 μm. The height H1 of the first via structure 200 may be larger than the height H2 of the second via structure 300. For example, the height H2 of the second via structure 300 may be 80% to 99% of the height H1 of the first via structure 200.

Except for the afore-described features in the structure of the first and second via structures 200 and 300, the semiconductor device in the present embodiment may be substantially the same as that described with reference to FIG. 2.

Figure 5:
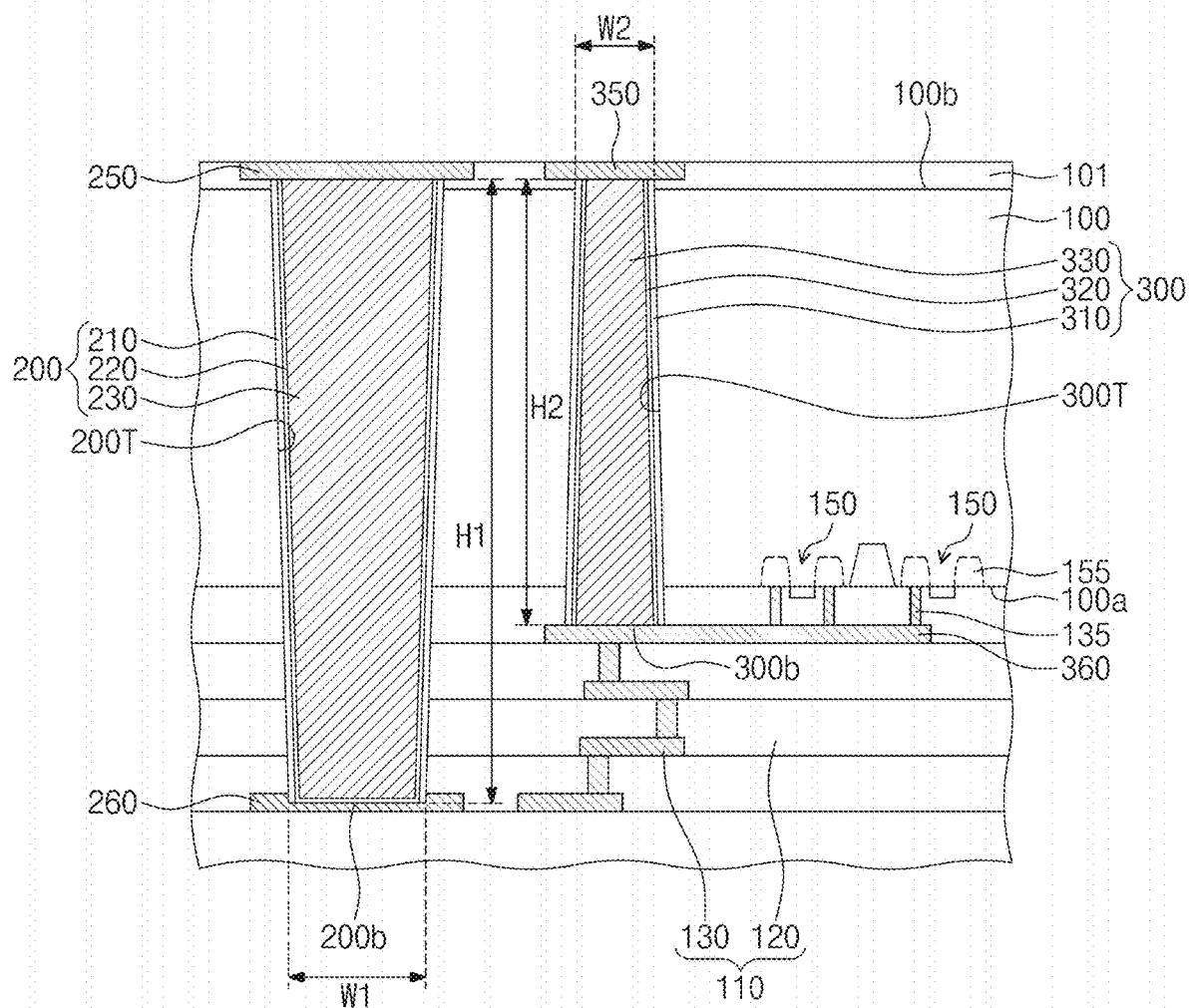
FIG. 5 is a sectional view illustrating a portion of a semiconductor device according to an example embodiment of the inventive concepts.

FIG. 5 is a sectional view illustrating a portion of a semiconductor device according to an example embodiment of the inventive concepts. In the following description, a previously described element may be identified by the same reference number without repeating an overlapping description thereof, for the sake of brevity.

Referring to FIG. 5, the first via structure 200 may be formed in the substrate 100 to penetrate the substrate 100 and a portion of the insulating layer 120. The first insulating pattern 210 may be provided on the inner side surface of the first via hole 200T. The first insulating pattern 210 may be conformally formed on the inner side surface of the first via hole 200T. The first insulating pattern 210 may be interposed between the substrate 100 and the outer side surface of the first barrier pattern 220 and between the insulating layer 120 and the outer side surface of the first barrier pattern 220. The first barrier pattern 220 may be provided on the inner side surface of the first insulating pattern 210 and the bottom surface of the first via hole 200T. The first barrier pattern 220 may be conformally formed on the inner side surface of the first insulating pattern 210 and the bottom surface of the first via hole 200T. The first barrier pattern 220 may be interposed between the inner side surface of the first insulating pattern 210 and the outer side surface of the first via 230 and may be extended into a region between the first lower pad 260 and the bottom surface of the first via 230. The first via 230 may be provided on the first barrier pattern 220. The first via 230 may fill a remaining portion of the first via hole 200T. The topmost surface of the first via 230 may be located at the same level as the topmost surface of the first insulating pattern 210 and the topmost surface of the first barrier pattern 220. The first via structure 200 may be provided to expose a portion of the top surface of the first lower pad 260. A width of the uppermost portion of the first via structure 200 may be larger than a width of the lowermost portion of the first via structure 200.

The second via structure 300 may be formed in the substrate 100 to penetrate the substrate 100 and a portion of the insulating layer 120. The second insulating pattern 310 may be conformally provided on the inner side surface of the second via hole 300T. The second insulating pattern 310 may be interposed between the substrate 100 and the outer side surface of the second barrier pattern 320 and between the insulating layer 120 and the outer side surface of the second barrier pattern 320. The second barrier pattern 320 may be conformally provided on the inner side surface of the second insulating pattern 310. The second barrier pattern 320 may be interposed between the inner side surface of the second insulating pattern 310 and the outer side surface of the second via 330. The second via 330 may be provided on the inner side surface of the second barrier pattern 320 and the second lower pad 360. The second via 330 may fill a remaining portion of the second via hole 300T. The topmost surface of the second via 330 may be located at the same level as the topmost surface of the second insulating pattern 310 and the topmost surface of the second barrier pattern 320. A width of the uppermost portion of the second via structure 300 may be smaller than a width of the lowermost portion of the second via structure 300.

The first via structure 200 and the second via structure 300 may have different widths from each other. The smallest width W1 of the first via structure 200 may be larger than the smallest width W2 of the second via structure 300. The smallest width W1 of the first via structure 200 may be 1.1 to 2 times the smallest width W2 of the second via structure 300. For example, the smallest width W1 of the first via structure 200 may range from 0.2 µm to 10 µm. For example, the smallest width W2 of the second via structure 300 may range from 0.1 µm to 5 µm.

The top surface of the first via structure 200 may be located at the same level as the top surface of the second via structure 300. The bottom surface 200b of the first via structure 200 and the bottom surface 300b of the second via structure 300 may be located at a level higher than the bottom surface of the circuit layer 110, when measured from the first surface 100a of the substrate 100. The bottom surface 200b of the first via structure 200 may be located at a level lower than the bottom surface 300b of the second via structure 300, when measured from the first surface 100a of the substrate 100. For example, a vertical distance between the bottom surface 200b of the first via structure 200 and the bottom surface 300b of the second via structure 300 may range from 0.1 µm to 10 µm. The height H1 of the first via structure 200 may be larger than the height H2 of the second via structure 300. For example, the height H2 of the second via structure 300 may be 80% to 99% of the height H1 of the first via structure 200.

Except for the afore-described features in the structure of the first and second via structures 200 and 300, the semiconductor device in the present embodiment may be substantially the same as that described with reference to FIG. 2.

Figure 6:
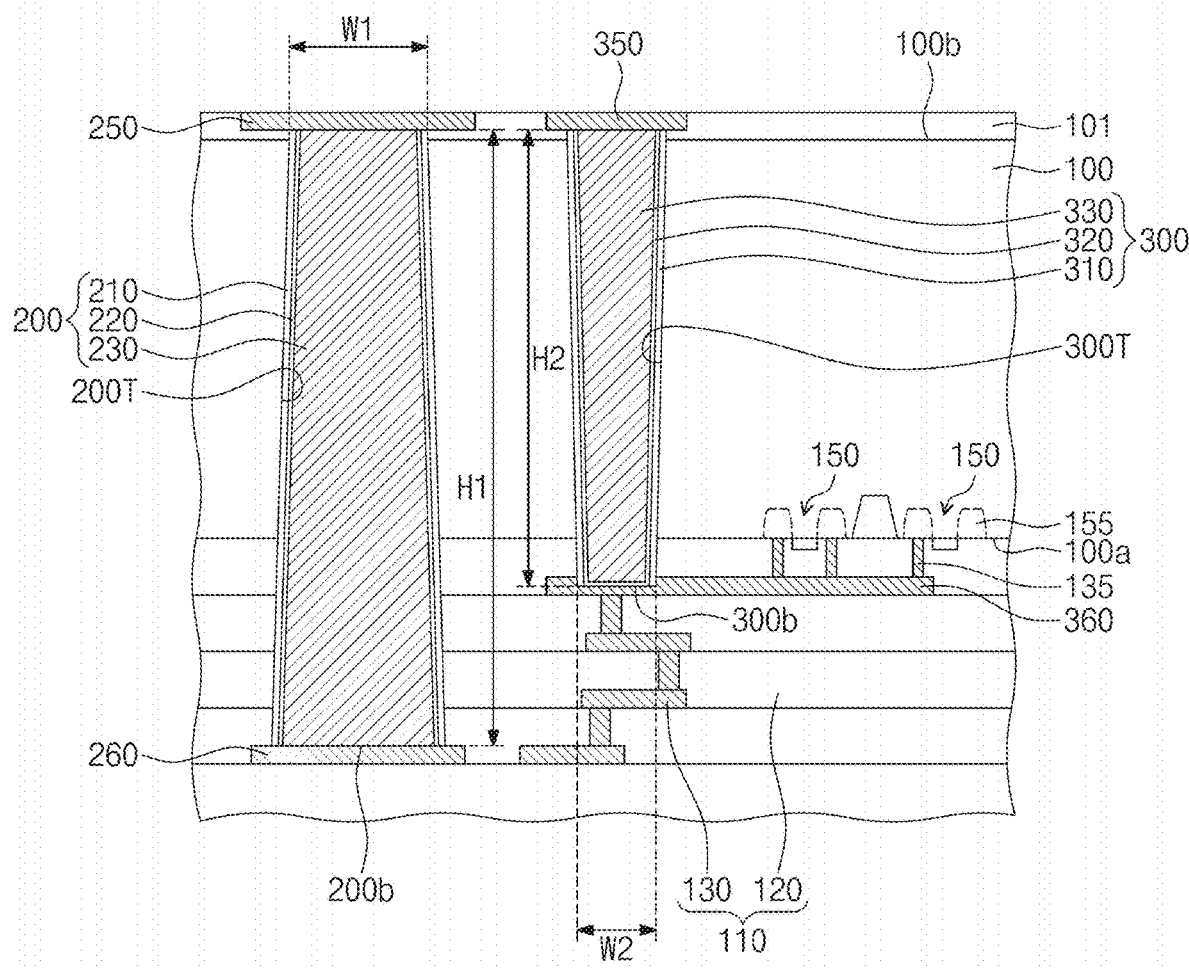
FIG. 6 is a sectional view illustrating a portion of a semiconductor device according to an example embodiment of the inventive concepts.

FIG. 6 is a sectional view illustrating a portion of a semiconductor device according to an example embodiment of the inventive concepts. In the following description, a previously described element may be identified by the same reference number without repeating an overlapping description thereof, for the sake of brevity.

Referring to FIG. 6, the first via structure 200 may be formed in the substrate 100 to penetrate the substrate 100 and a portion of the insulating layer 120. The first insulating pattern 210 may be conformally provided on the inner side surface of the first via hole 200T. The first insulating pattern 210 may be interposed between the substrate 100 and the outer side surface of the first barrier pattern 220 and between the insulating layer 120 and the outer side surface of the first barrier pattern 220. The first barrier pattern 220 may be conformally provided on the inner side surface of the first insulating pattern 210. The first barrier pattern 220 may be interposed between the inner side surface of the first insulating pattern 210 and the outer side surface of the first via 230. The first via 230 may be provided on the inner side surface of the first barrier pattern 220 and the first lower pad 260. The first via 230 may fill a remaining portion of the first via hole 200T. The topmost surface of the first via 230 may be located at the same level as the topmost surface of the first insulating pattern 210 and the topmost surface of the first barrier pattern 220. A width of the uppermost portion of the first via structure 200 may be smaller than a width of the lowermost portion of the first via structure 200.

The second via structure 300 may be formed in the substrate 100 to penetrate the substrate 100 and a portion of the insulating layer 120. The second insulating pattern 310 may be provided on the inner side surface of the second via hole 300T. The second insulating pattern 310 may be formed to conformally cover the inner side surface of the second via hole 300T. The second insulating pattern 310 may be interposed between the substrate 100 and the outer side surface of the second barrier pattern 320 and between the insulating layer 120 and the outer side surface of the second barrier pattern 320. The second barrier pattern 320 may be provided on the inner side surface of the second insulating pattern 310 and the bottom surface of the second via hole 300T. The second barrier pattern 320 may be formed to conformally cover the inner side surface of the second insulating pattern 310 and the bottom surface of the second via hole 300T. The second barrier pattern 320 may be interposed between the inner side surface of the second insulating pattern 310 and the outer side surface of the second via 330 and may be extended into a region between the second lower pad 360 and the bottom surface of the second via 330. The second via 330 may be provided on the second barrier pattern 320. The second via 330 may fill a remaining portion of the second via hole 300T. The topmost surface of the second via 330 may be located at the same level as the topmost surface of the second insulating pattern 310 and the topmost surface of the second barrier pattern 320. The second via structure 300 may be provided to expose a portion of the top surface of the second lower pad 360. A width of the uppermost portion of the second via structure 300 may be larger than a width of the lowermost portion of the second via structure 300.

The first via structure 200 and the second via structure 300 may have different widths from each other. The smallest width W1 of the first via structure 200 may be larger than the smallest width W2 of the second via structure 300. The smallest width W1 of the first via structure 200 may be 1.1 to 2 times the smallest width W2 of the second via structure 300. For example, the smallest width W1 of the first via structure 200 may range from 0.2 µm to 10 µm. For example, the smallest width W2 of the second via structure 300 may range from 0.1 µm to 5 µm.

The top surface of the first via structure 200 may be located at the same level as the top surface of the second via structure 300. The bottom surface 200b of the first via structure 200 and the bottom surface 300b of the second via structure 300 may be located at a level higher than the bottom surface of the circuit layer 110, when measured from the first surface 100a of the substrate 100. The bottom surface 200b of the first via structure 200 may be located at a level lower than the bottom surface 300b of the second via structure 300, when measured from the first surface 100a of the substrate 100. For example, a vertical distance between the bottom surface 200b of the first via structure 200 and the bottom surface 300b of the second via structure 300 may range from 0.1 µm to 10 µm. The height H1 of the first via structure 200 may be larger than the height H2 of the second via structure 300. For example, the height H2 of the second via structure 300 may be 80% to 99% of the height H1 of the first via structure 200.

Except for the afore-described features in the structure of the first and second via structures 200 and 300, the semiconductor device in the present embodiment may be substantially the same as that described with reference to FIG. 2.

FIGS. 7 to 11 are enlarged sectional views illustrating a method of fabricating a semiconductor device, according to an example embodiment of the inventive concepts, and in particular, corresponding to a portion A of FIG. 1.

Figure 7:
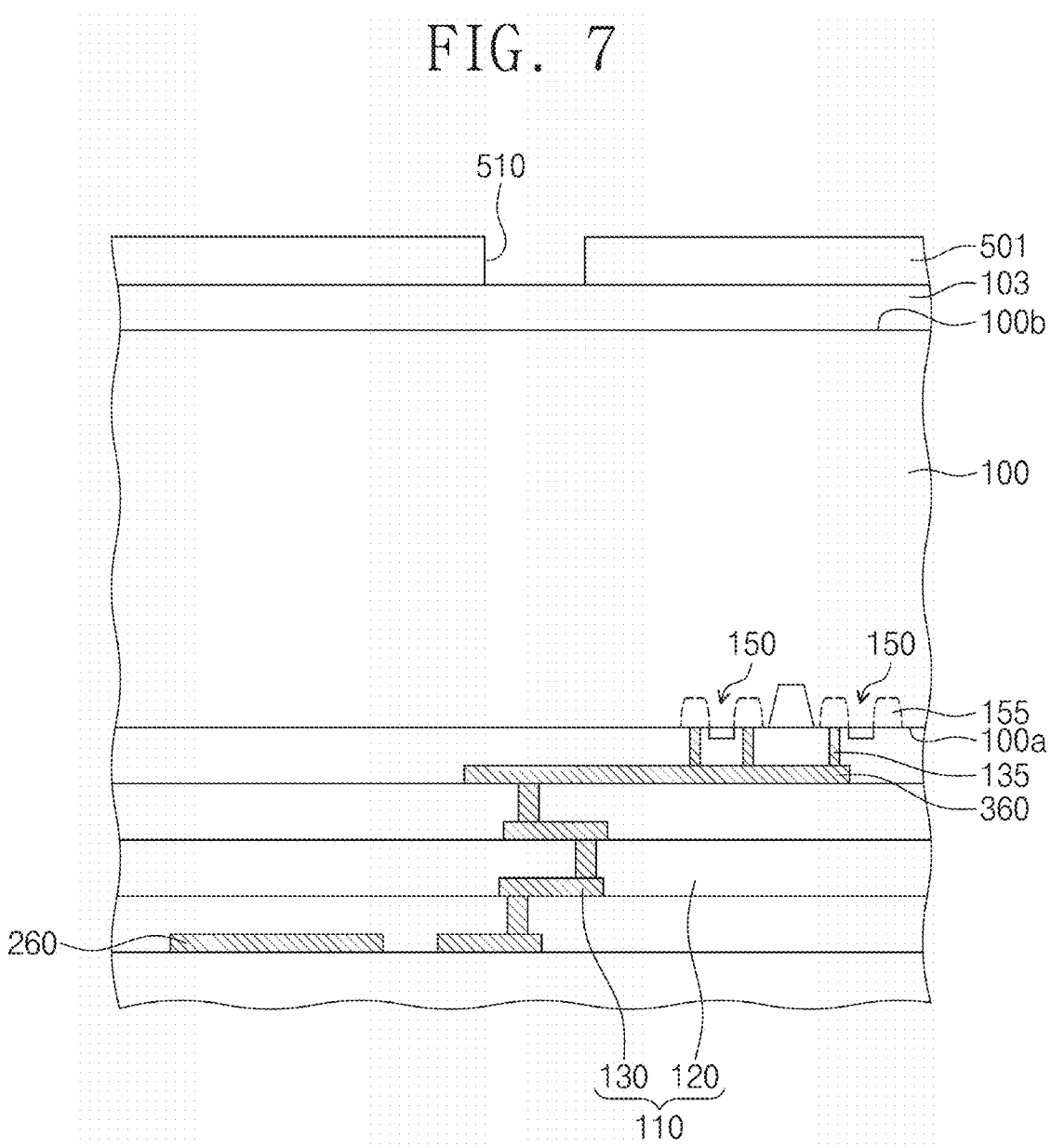
FIGS. 7 to 11 are enlarged sectional views illustrating a method of fabricating a semiconductor device, according to an example embodiment of the inventive concepts, and in particular, corresponding to a portion A of FIG. 1.

Referring to FIG. 7, the substrate 100 may be provided. An impurity injection process may be performed on the first surface 100a of the substrate 100 to form the doped region 155. The integrated circuits 150 may be formed on the first surface 100a of the substrate 100. The formation of the integrated circuits 150 may include forming the doped region 155. The circuit layer 110 may be formed on the first surface 100a of the substrate 100. The formation of the circuit layer 110 may include stacking a plurality of insulating layers 120 on the first surface 100a of the substrate 100. The insulating layers 120 may be formed on the first surface 100a of the substrate 100 to cover the integrated circuits 150. Each or at least one of the insulating layers 120 may be formed by an atomic layer deposition (ALD), chemical vapor deposition (CVD), or physical vapor deposition (PVD) process. The metal lines 130, the circuit lines 135, the first lower pad 260, and the second lower pad 360 may be provided. The circuit lines 135 may be formed to penetrate the insulating layers 120 and may be coupled to the integrated circuits 150. The insulating layers 120 may be formed to cover the metal lines 130, the circuit lines 135, the first lower pad 260, and the second lower pad 360.

A polishing or grinding process may be performed on the second surface 100b of the substrate 100 to remove a portion of the substrate 100. The polishing process may be a chemical mechanical polishing (CMP) process. Thus, the substrate 100 may be thinned. An upper insulating layer 103 may be formed on the second surface 100b of the substrate 100. A first mask pattern 501 may be formed on the upper insulating layer 103. The first mask pattern 501 may be formed to have a first opening 510 exposing the substrate 100.

Figure 8:
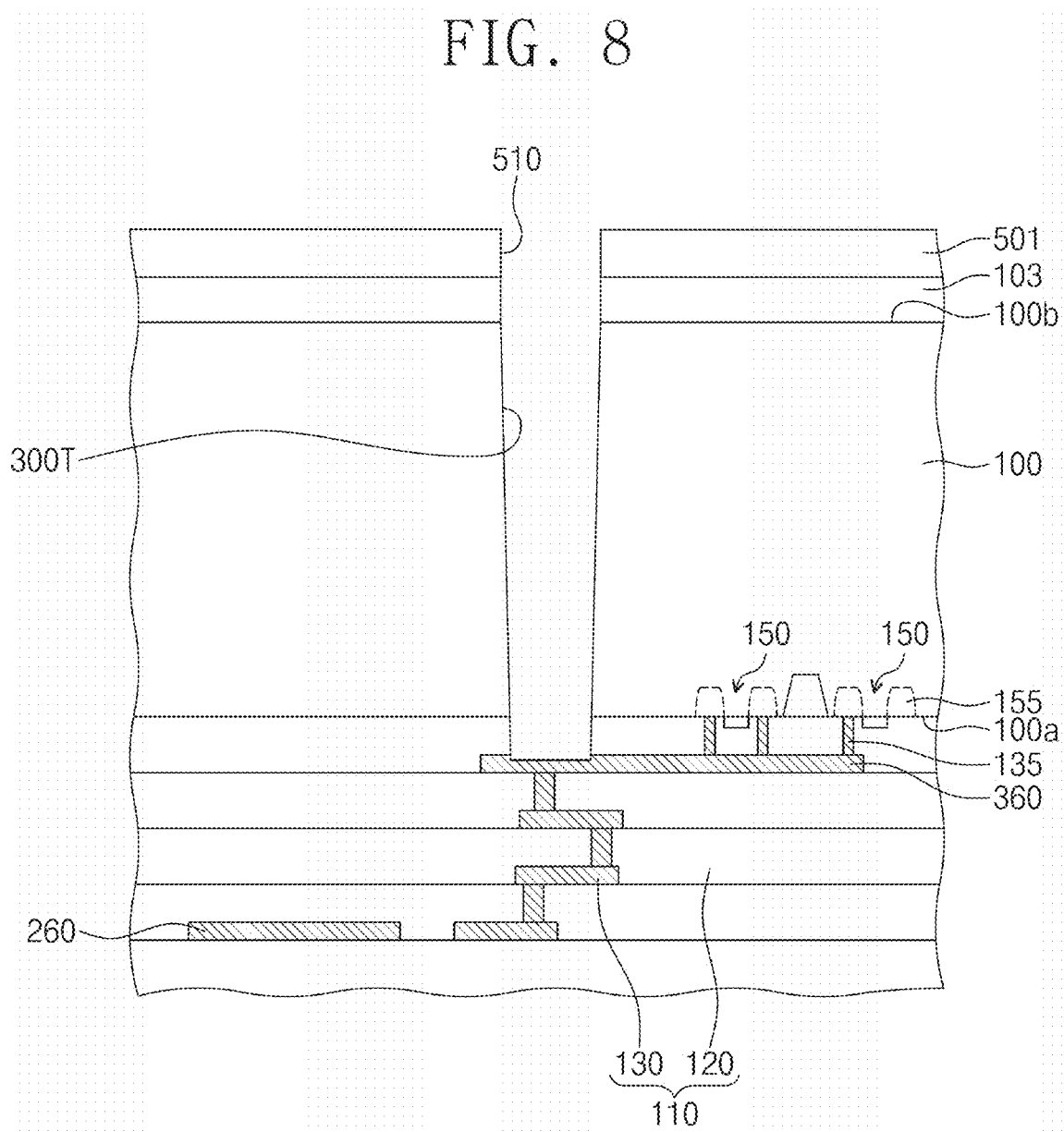

Referring to FIG. 8, the second via hole 300T may be formed in the substrate 100. The formation of the second via hole 300T may include etching the substrate 100 using the first mask pattern 501. For example, the etching process of the substrate 100 may be performed using a dry etching process, in which a fluorine-containing gas is used, or a plasma etching process. An upper portion of the second lower pad 360 and the insulating layer 120 may be partially exposed through the second via hole 300T, as a result of the etching process.

Figure 9:
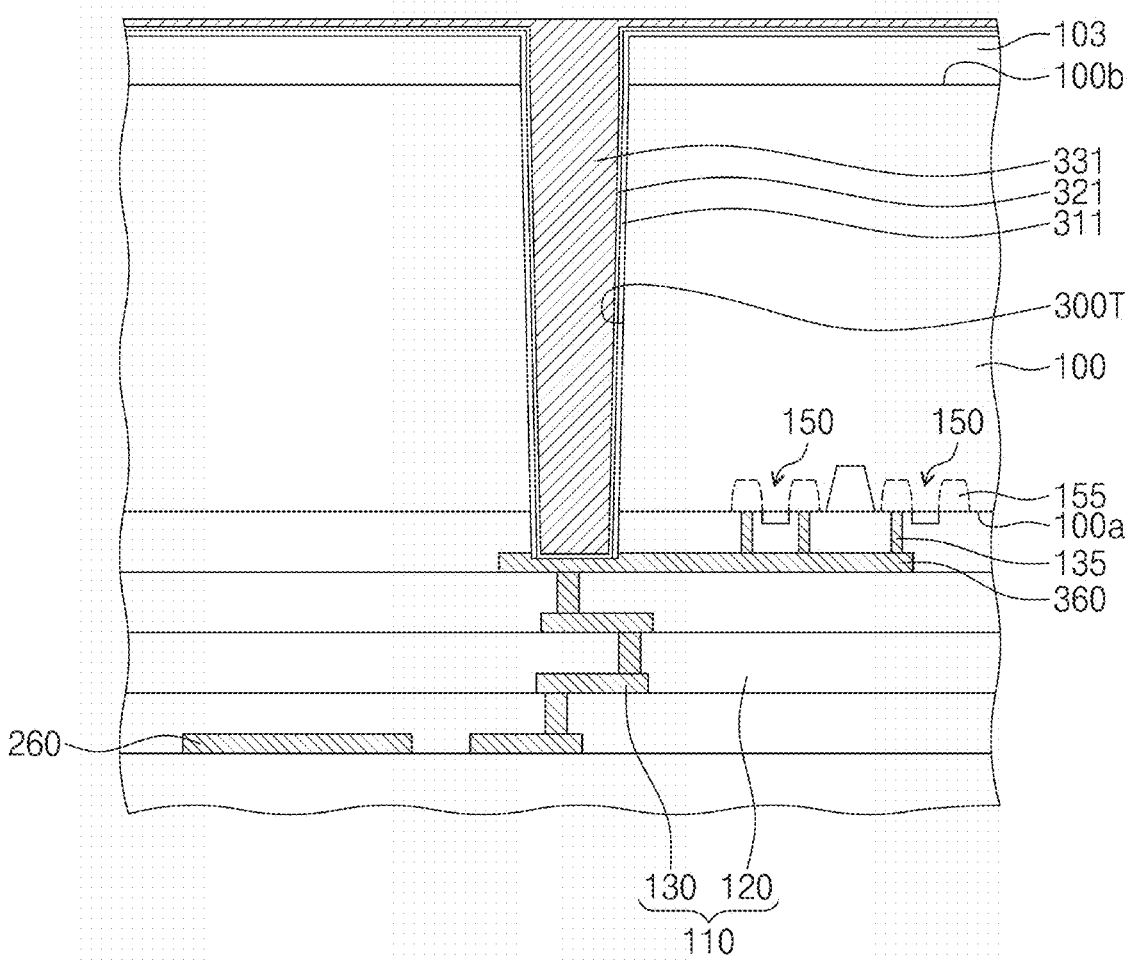

Referring to FIG. 9, a second via insulating layer 311 may be formed on the inner side surface of the second via hole 300T. The formation of the second via insulating layer 311 may include conformally forming an insulating layer on the second via hole 300T and removing the insulating layer from the bottom surface of the second via hole 300T. The removal of the insulating layer from the bottom surface of the second via hole 300T may be performed by a dry etching process, in which a fluorine-containing gas is used, or by a plasma etching process. As a result of the etching process, a portion of the second lower pad 360 may be exposed. Thereafter, a second barrier layer 321 and a second via layer 331 may be sequentially formed on an inner side surface of the second via insulating layer 311 and the exposed portion of the second lower pad 360. The second barrier layer 321 may conformally cover the inner side surface of the second via insulating layer 311 and the exposed top surface of the second lower pad 360. Here, the second via layer 331 may be formed on the second barrier layer 321 to fill a remaining portion of the second via hole 300T. Each or at least one of the second via insulating layer 311 and the second barrier layer 321 may be formed by an atomic layer deposition (ALD), chemical vapor deposition (CVD), or physical vapor deposition (PVD) process. The second via layer 331 may be formed by an electroplating process (e.g., using the second barrier layer 321 as a seed electrode).

Figure 10:
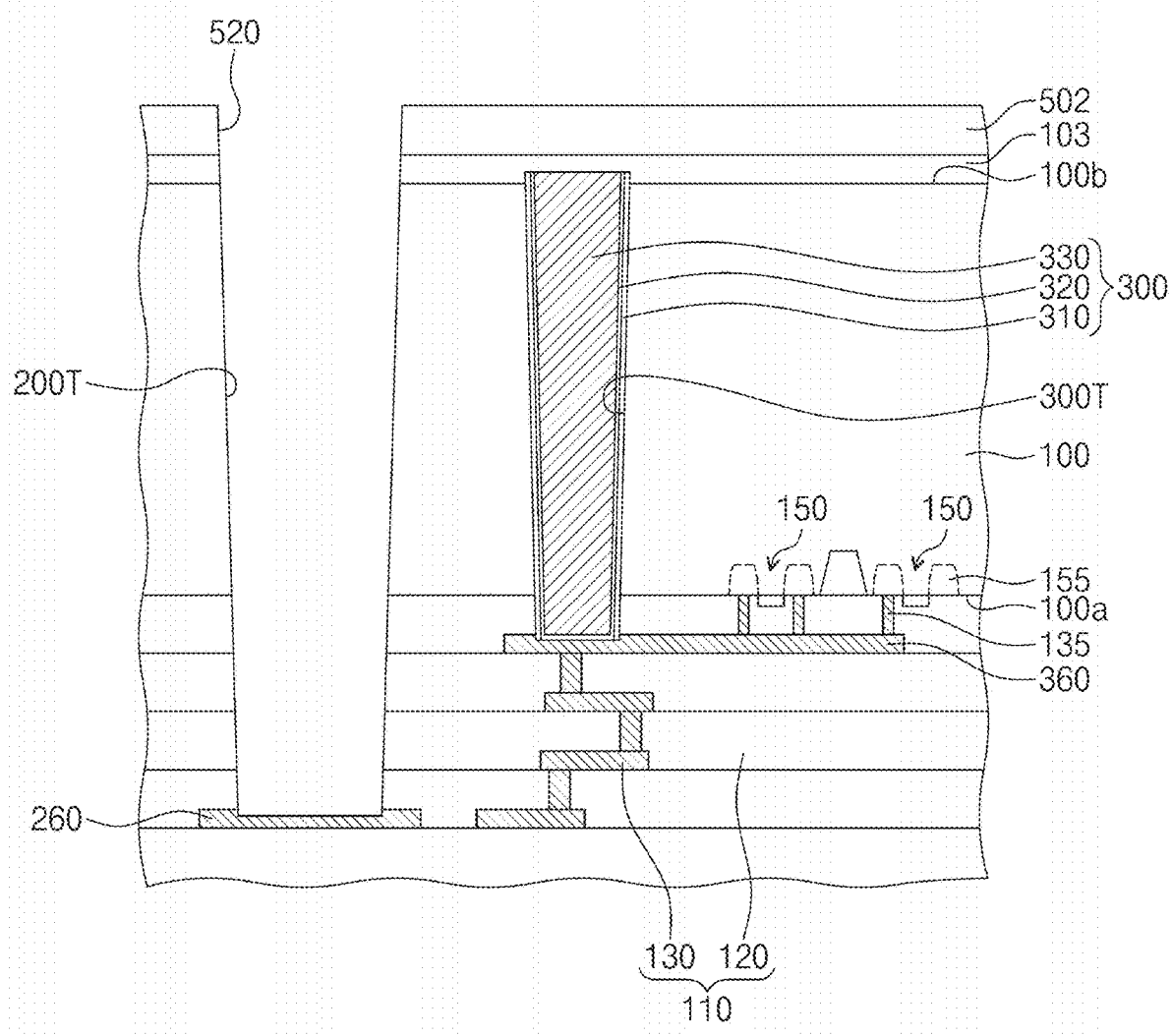

Referring to FIG. 10, a planarization process may be performed on the second surface 100b of the substrate 100 to form the second via structure 300. The second via structure 300 may include the second insulating pattern 310, the second barrier pattern 320, and the second via 330. The planarization process may include a chemical mechanical polishing (CMP) process. The second insulating pattern 310, the second barrier pattern 320, and the second via 330 may be respectively formed from the second via insulating layer 311, the second barrier layer 321, and the second via layer 331 through the planarization process. As a result of the planarization process, the second via insulating layer 311, the second barrier layer 321, and the second via layer 331 may be removed from the second surface 100b of the substrate 100.

A second mask pattern 502 may be formed on the upper insulating layer 103. The second mask pattern 502 may be formed to have a second opening 520 exposing the substrate 100. The first via hole 200T may be formed in the substrate 100. The formation of the first via hole 200T may include etching the substrate 100 using the second mask pattern 502 as a mask. For example, the etching process of the substrate 100 may be performed by a dry etching process, in which a fluorine-containing gas is used. In an example embodiment, the etching process of the substrate 100 may be performed to expose the insulating layer 120 and a portion of an upper portion of the first lower pad 260. The first via hole 200T may be formed to have width and height, which are larger than those of the second via hole 300T.

Figure 11:
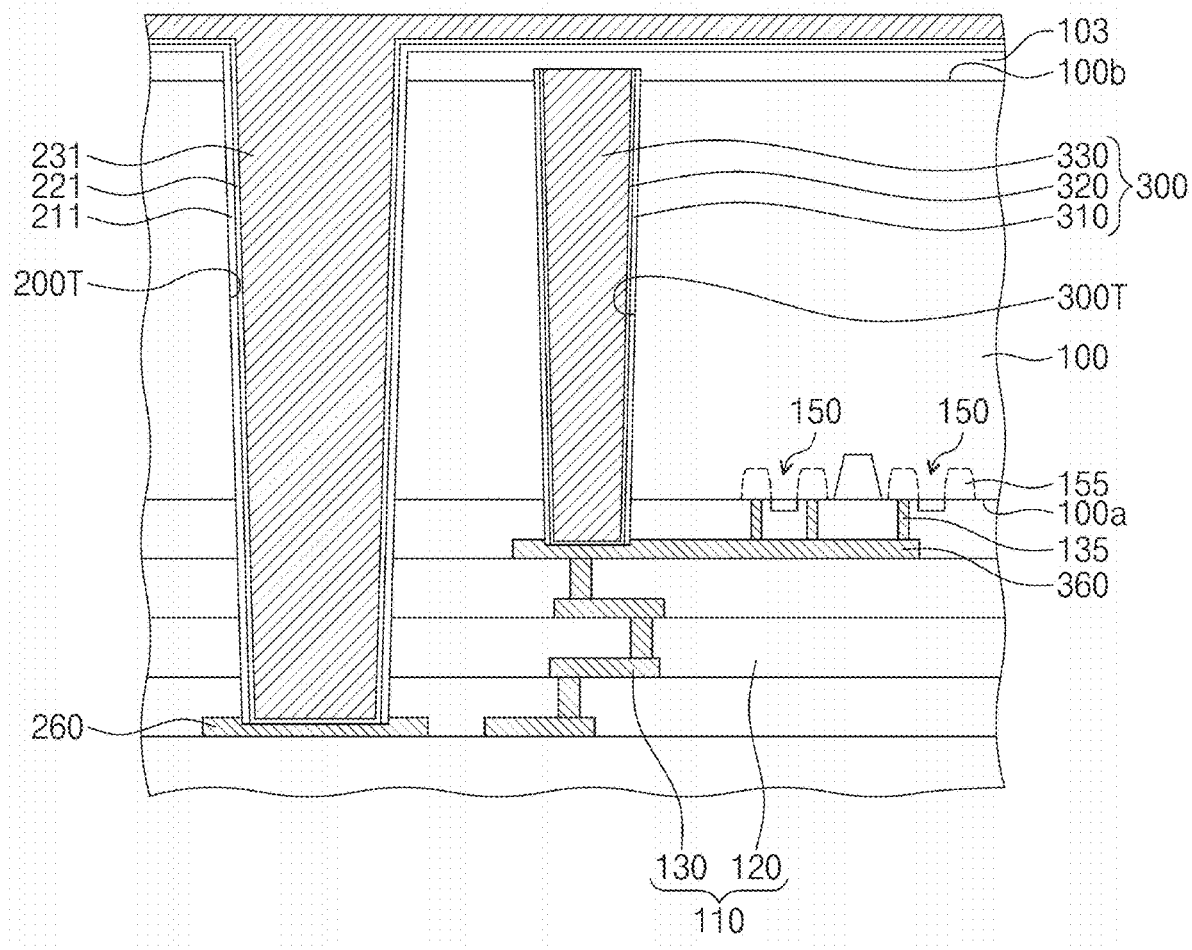

Referring to FIG. 11, a first via insulating layer 211 may be formed on the inner side surface of the first via hole 200T. The formation of the first via insulating layer 211 may include forming an insulating layer to conformally cover the first via hole 200T and removing the insulating layer from the bottom surface of the first via hole 200T. The removal of the insulating layer from the bottom surface of the first via hole 200T may be performed by a dry etching process, in which a fluorine-containing gas is used, or a plasma etching process. As a result of the etching process, a portion of the first lower pad 260 may be exposed. A first barrier layer 221 and a first via layer 231 may be sequentially formed on an inner side surface of the first via insulating layer 211 and the exposed portion of the first lower pad 260. The first barrier layer 221 may conformally cover the inner side surface of the first via insulating layer 211 and the exposed top surface of the first lower pad 260. The first via layer 231 may be formed on the first barrier layer 221 to fill a remaining portion of the first via hole 200T. Each or at least one of the first via insulating layer 211 and the first barrier layer 221 may be formed by an atomic layer deposition (ALD), chemical vapor deposition (CVD), or physical vapor deposition (PVD) process. The first via layer 231 may be formed by an electroplating process (e.g., using the first barrier layer 221 as a seed electrode).

Referring back to FIG. 2, a planarization process may be performed on the second surface 100b of the substrate 100 to form the first via structure 200. The first via structure 200 may include the first insulating pattern 210, the first barrier pattern 220, and the first via 230. The planarization process may include a chemical mechanical polishing (CMP) process. The first insulating pattern 210, the first barrier pattern 220, and the first via 230 may be respectively formed from the first via insulating layer 211, the first barrier layer 221, and the first via layer 231 through the planarization process. The first via insulating layer 211, the first barrier layer 221, the first via layer 231, and the upper insulating layer 103 may be removed from the second surface 100b of the substrate 100 by the planarization process. The first upper pad 250 may be formed on the first via structure 200 and electrically connected to the first via structure 200, and the second upper pad 350 may be formed on the second via structure 300 and electrically connected to the second via structure 300.

Except for the afore-described features, it may be substantially the same as those described with reference to FIG. 2. In an example embodiment, the process of forming the second via structure 300 may be performed after the process of forming the first via structure 200, unlike the method described above.

Figure 12:
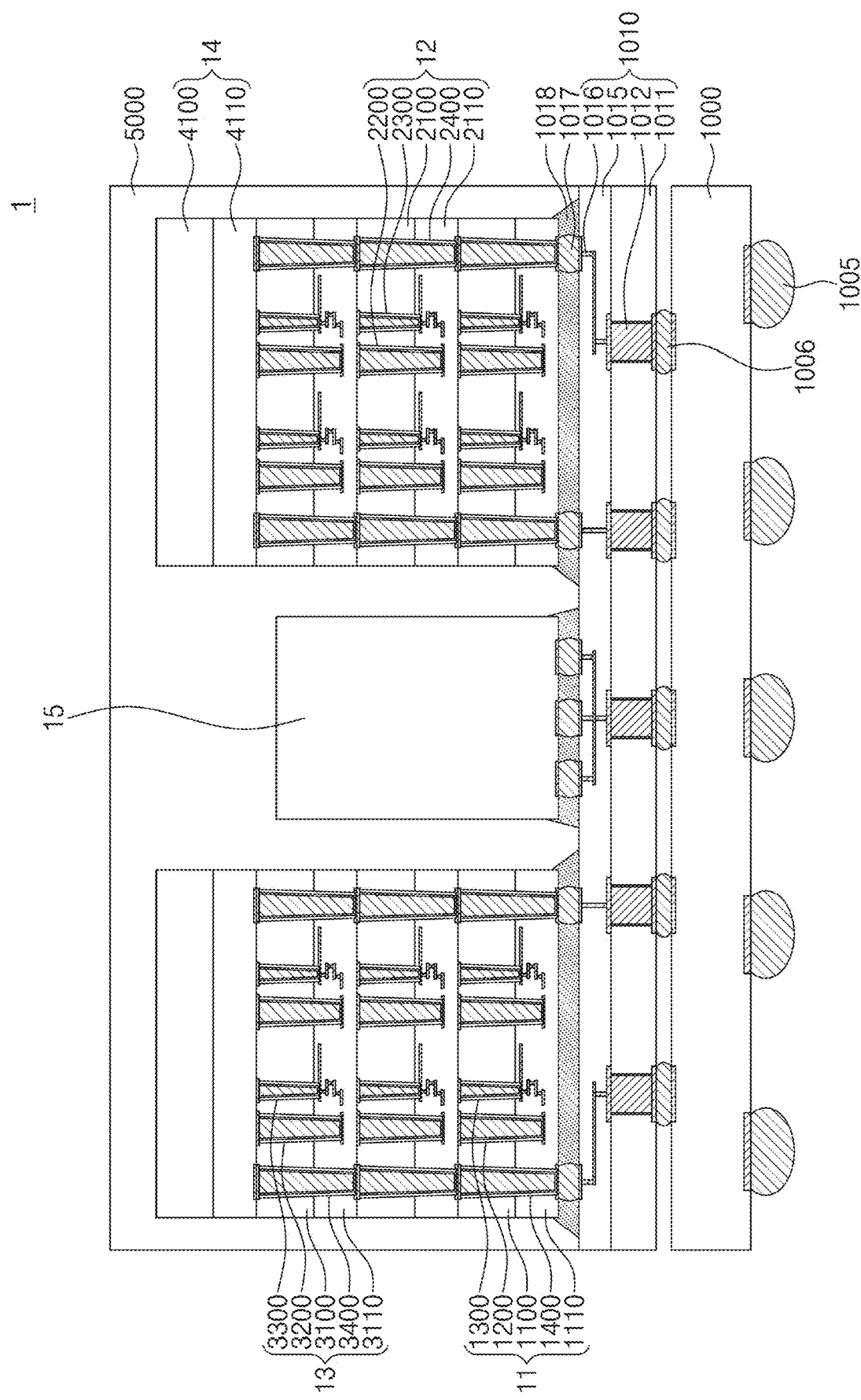
FIG. 12 is a sectional view illustrating a semiconductor package according to an example embodiment of the inventive concepts.

FIG. 12 is a sectional view illustrating a semiconductor package according to an example embodiment of the inventive concepts. In the following description, a previously described element may be identified by the same reference number without repeating an overlapping description thereof, for the sake of brevity.

Referring to FIG. 12, a semiconductor package 1 may include a package substrate 1000, an interposer substrate 1010, first to fifth semiconductor chips 11, 12, 13, 14, and 15, and a mold layer 5000.

The package substrate 1000 may include a printed circuit board or a redistribution layer. An outer terminal 1005 may be disposed on a bottom surface of the package substrate 1000, and substrate bumps 1006 may be disposed on a top surface of the package substrate 1000. The substrate bumps 1006 may be electrically connected to the outer terminal 1005 through an internal line (not shown) in the package substrate 1000. The interposer substrate 1010 may be disposed on the package substrate 1000. The interposer substrate 1010 may be a silicon (Si) substrate. The package substrate 1000 and the interposer substrate 1010 may be electrically connected to each other through the substrate bumps 1006. The interposer substrate 1010 may include a substrate layer 1011 and an interconnection layer 1015 on the substrate layer 1011. A plurality of through electrodes 1012 may be disposed in the substrate layer 1011 and may be provided to penetrate the substrate layer 1011. The interconnection layer 1015 may include lower metal lines 1016. The through electrodes 1012 and the lower metal lines 1016 may be electrically connected to each other.

The first semiconductor chip 11 and the fifth semiconductor chip 15 may be mounted on the interposer substrate 1010 to be spaced apart from each other in a direction parallel to a top surface of the package substrate 1000. The second to fourth semiconductor chips 12, 13, and 14 may be sequentially stacked on the first semiconductor chip 11. The first to fourth semiconductor chips 11, 12, 13, and 14 may be stacked to form at least one chip stack. The first to fourth semiconductor chips 11, 12, 13, and 14 may be or include memory chips (e.g., DRAM chips). The memory chips may include high bandwidth memory (HBM) chips. The fifth semiconductor chip 15 may include a logic chip, a buffer chip, or a system-on-chip (SOC). The fifth semiconductor chip 15 may include a central processing unit (CPU) or a graphic processing unit (GPU).

At least one of the first to fourth semiconductor chips 11, 12, 13, and 14 may be the same as the semiconductor device 10 previously described with reference to FIG. 1. The first semiconductor chip 11 may include a first substrate 1100, a first circuit layer 1110, a lower first via structure 1200, a lower second via structure 1300, and a lower third via structure 1400. The second semiconductor chip 12 may include a second substrate 2100, a second circuit layer 2110, an intermediate first via structure 2200, an intermediate second via structure 2300, and an intermediate third via structure 2400. The third semiconductor chip 13 may include a third substrate 3100, a third circuit layer 3110, an upper first via structure 3200, an upper second via structure 3300, and an upper third via structure 3400. The fourth semiconductor chip 14 may include a fourth substrate 4100 and a fourth circuit layer 4110.

The first to fourth substrates 1100, 2100, 3100, and 4100 may be the same as the substrate 100 previously described with reference to FIGS. 1 and 2. The first to fourth circuit layers 1110, 2110, 3110, and 4110 may be the same as the circuit layer 110 previously described with reference to FIGS. 1 and 2. The lower first via structure 1200, the intermediate first via structure 2200, and the upper first via structure 3200 may be the same as the first via structure 200 previously described with reference to FIGS. 1 and 2. The lower second via structure 1300, the intermediate second via structure 2300, and the upper second via structure 3300 may be the same as the second via structure 300 previously described with reference to FIGS. 1 and 2. The lower third via structure 1400, the intermediate third via structure 2400, and the upper third via structure 3400 may be the same as the third via structure 400 previously described with reference to FIGS. 1 and 2. The first to fourth semiconductor chips 11, 12, 13, and 14 may be electrically connected to each other through the lower third via structure 1400, the intermediate third via structure 2400, and the upper third via structure 3400. However, unlike that shown in FIG. 12, the fourth semiconductor chip 14 and the fifth semiconductor chip 15 may include the first, second, and third via structures 200, 300, and 400 described with reference to FIG. 1. The number of the semiconductor chips is not limited to that in the illustrated example.

Chip bumps 1017 may be interposed between the interposer substrate 1010 and the first semiconductor chip 11 and between the interposer substrate 1010 and the fifth semiconductor chip 15. The interposer substrate 1010 may be electrically connected to the first and fifth semiconductor chips 11 and 15 through the chip bumps 1017. The first and fifth semiconductor chips 11 and 15 may be electrically connected to the outer terminals 1005 through the substrate bumps 1006. An under fill layer 1018 may be interposed between the interposer substrate 1010 and the first semiconductor chip 11 and between the interposer substrate 1010 and the fifth semiconductor chip 15 to fill a space between the chip bumps 1017. The under fill layer 1018 may be formed of or include an insulating polymer material (e.g., epoxy resin) or a non-conductive film (NCF) (e.g., Ajinomoto Build-up Film (ABF)). The mold layer 5000 may be provided on the interposer substrate 1010 to cover the first to fifth semiconductor chips 11, 12, 13, 14, and 15. The mold layer 5000 may be formed of or include an insulating polymer (e.g., epoxy molding compound).

Figure 13:
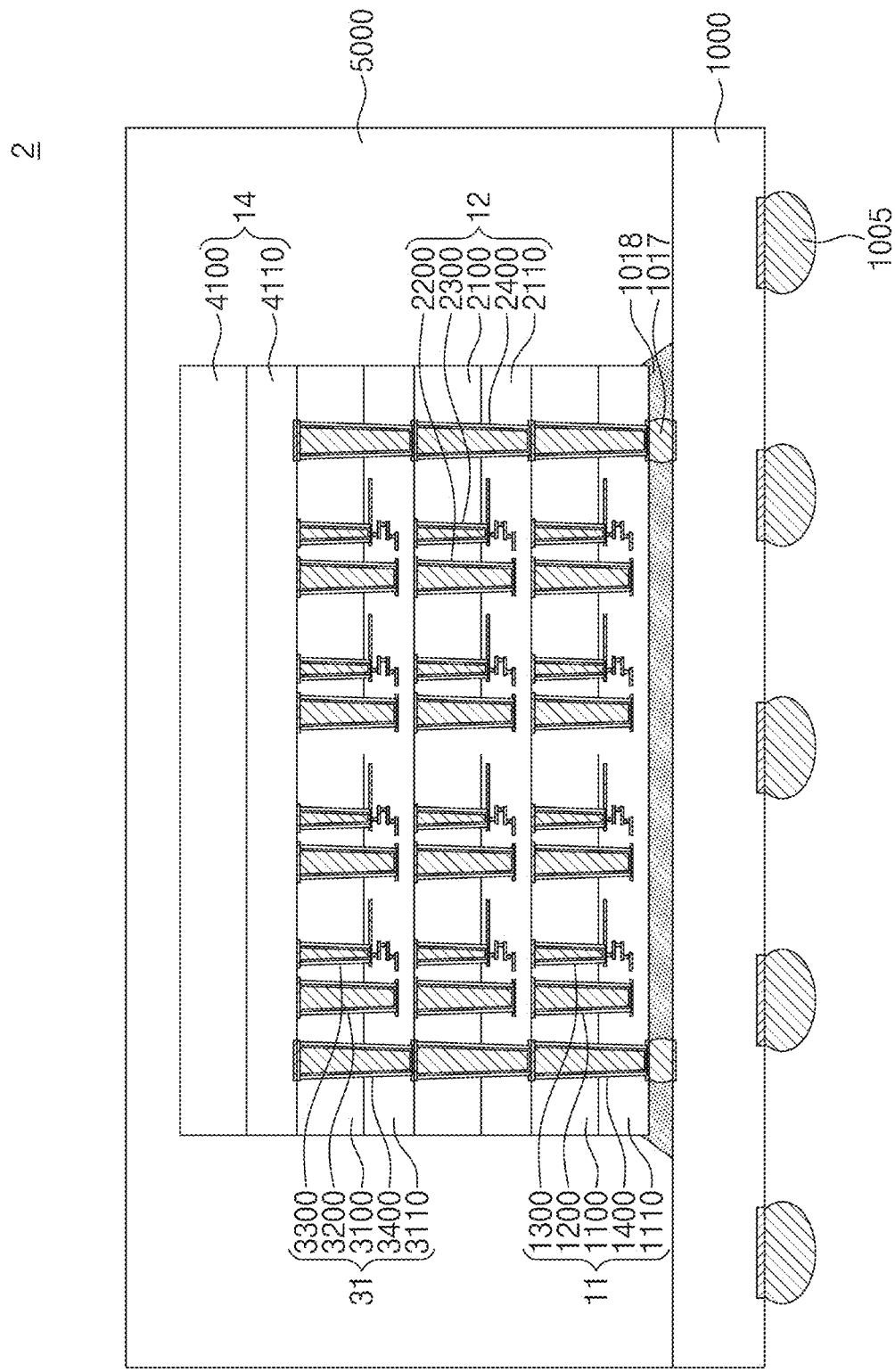
FIG. 13 is a sectional view illustrating a semiconductor package according to an example embodiment of the inventive concepts.

FIG. 13 is a sectional view illustrating a semiconductor package according to an example embodiment of the inventive concepts. In the following description, a previously described element may be identified by the same reference number without repeating an overlapping description thereof, for the sake of brevity.

Referring to FIG. 13, a semiconductor package 2 may include the package substrate 1000, the first to fourth semiconductor chips 11, 12, 13, and 14, and the mold layer 5000.

The first semiconductor chip 11 may be mounted on the package substrate 1000. The second to fourth semiconductor chips 12, 13, and 14 may be sequentially stacked on the first semiconductor chip 11. The first semiconductor chip 11 may include a logic chip, a buffer chip, or a system-on-chip (SOC). The fifth semiconductor chip 15 may include a central processing unit (CPU) or a graphic processing unit (GPU). The second to fourth semiconductor chips 12, 13, and 14 may be memory chips and may include, for example, DRAM chips.

At least one of the first to fourth semiconductor chips 11, 12, 13, and 14 may be the same as the semiconductor device 10 previously described with reference to FIG. 1. However, unlike that shown in FIG. 13, the fourth semiconductor chip 14 may include the first, second, and third via structures 200, 300, and 400 described with reference to FIG. 1. The number of the semiconductor chips is not limited to that in the illustrated example.

The chip bumps 1017 may be interposed between the package substrate 1000 and the first semiconductor chip 11. The first semiconductor chip 11 may be electrically connected to the package substrate 1000 and the outer terminals 1005 through the chip bumps 1017. The under fill layer 1018 may be interposed between the package substrate 1000 and the first semiconductor chip 11 to fill a space between the chip bumps 1017.

Figure 14:
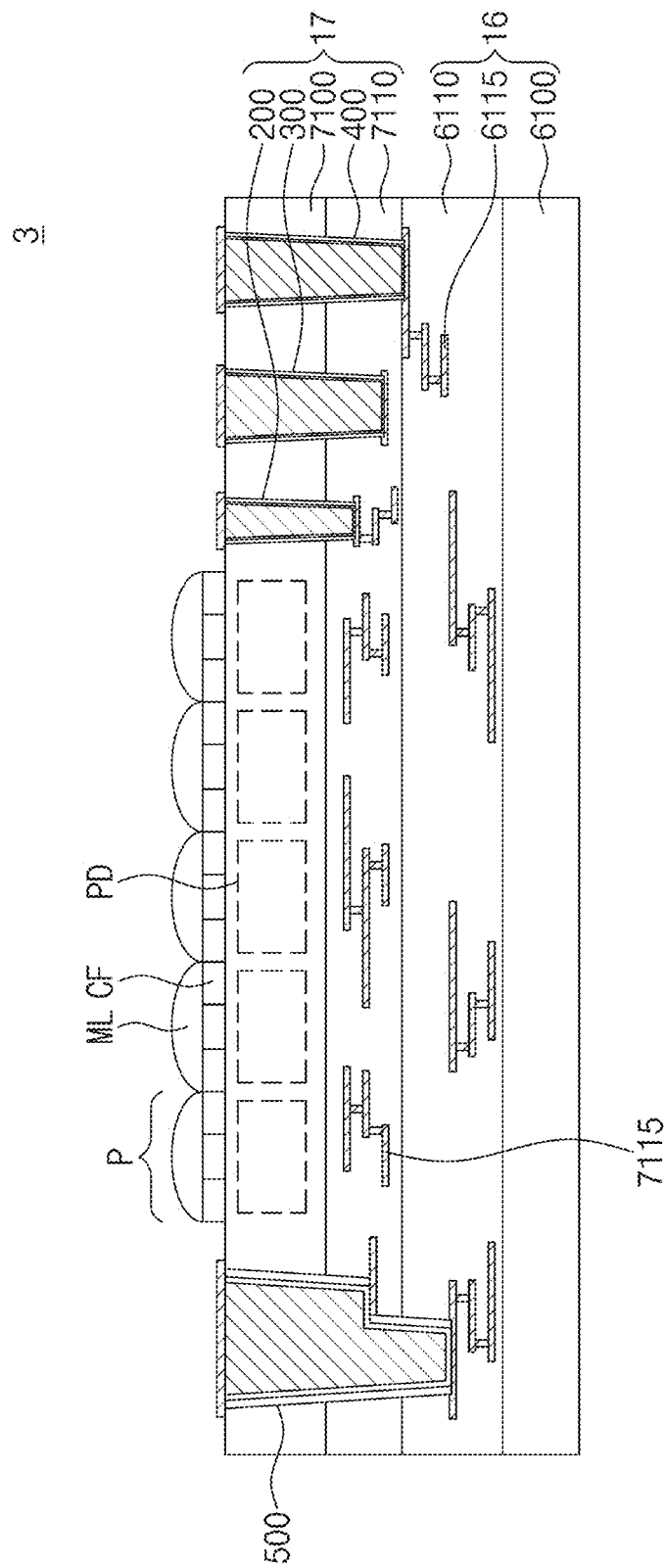
FIG. 14 is a sectional view illustrating an image sensor according to an example embodiment of the inventive concepts.

FIG. 14 is a sectional view illustrating an image sensor according to an example embodiment of the inventive concepts. In the following description, a previously described element may be identified by the same reference number without repeating an overlapping description thereof, for the sake of brevity. An image sensor 3 may include a lower semiconductor chip 16 and an upper semiconductor chip 17.

The upper semiconductor chip 17 may be provided on the lower semiconductor chip 16. The upper semiconductor chip 17 may be a sensing chip. For example, the upper semiconductor chip 17 may include a photo diode, which is used to sense light. The lower semiconductor chip 16 may include a logic chip, which is configured to process electric signals produced in the upper semiconductor chip 17 by the light incident.

The lower semiconductor chip 16 may include a lower semiconductor layer 6100 and a lower circuit layer 6110 on the semiconductor layer 6100. The lower semiconductor layer 6100 may be formed of or include a semiconductor material and may be, for example, a layer formed of at least one of silicon (Si), silicon germanium (SiGe), or doped semiconductor materials. Integrated circuits may be provided in the lower semiconductor layer 6100. For example, the integrated circuits may be logic devices. The lower circuit layer 6110 may include a lower interconnection pattern 6115. The lower circuit layer 6110 may be electrically connected to the integrated circuits in the lower semiconductor layer 6100 through the lower interconnection pattern 6115.

The upper semiconductor chip 17 may include an upper circuit layer 7110, an upper semiconductor layer 7100, color filters CF, micro lenses ML, and a fourth via structure 500, in addition to the first via structure 200, the second via structure 300, and the third via structure 400. The upper circuit layer 7110 may be disposed below in a lower portion of the upper semiconductor chip 17 to be adjacent to the lower semiconductor chip 16. The upper circuit layer 7110 may include an integrated circuit (e.g., transistors), which is used to control operations of photoelectric conversion devices PD, and an upper interconnection pattern 7115. The upper semiconductor layer 7100 may be disposed on the upper circuit layer 7110. The upper semiconductor layer 7100 may be formed of or include a semiconductor material and may be, for example, a silicon layer, a silicon-germanium layer, or a doped semiconductor layer.

The photoelectric conversion devices PD may be provided in the upper semiconductor layer 7100. Each of the photoelectric conversion devices PD may be independently configured to collect light, which is incident through a top surface of the upper semiconductor chip 17. The photoelectric conversion devices PD may have a different conductivity type from the upper semiconductor layer 7100. The upper circuit layer 7110 may be electrically connected to the photoelectric conversion devices PD in the upper semiconductor layer 7100. The color filters CF may be disposed on a top surface of the upper semiconductor layer 7100. The color filters CF may be disposed at regions corresponding to the photoelectric conversion devices PD. Each of the color filters CF may be one of red, green, blue, and white color filters. The micro lenses ML may be disposed on the color filters CF. The color filters CF, the micro lenses ML, and the photoelectric conversion devices PD may constitute a plurality of unit pixels P, each of which is composed of one color filter CF, one micro lens ML, and at least one photoelectric conversion device PD. The unit pixels P may be two-dimensionally arranged on the top surface of the upper semiconductor layer 7100.

The fourth via structure 500 may be provided to fully penetrate the upper semiconductor chip 17 and to partially penetrate the lower semiconductor chip 16. The fourth via structure 500 may be electrically connected to the upper interconnection pattern 7115 and may be electrically connected to the lower interconnection pattern 6115.

The first, second, and third via structures 200, 300, and 400 may be respectively configured to have substantially the same features as the first, second, and third via structures 200, 300, and 400 described with reference to FIGS. 1 and 2.

In a semiconductor device according to an example embodiment of the inventive concepts, vias may be provided to have widths, heights, and bottom surface levels, which are adjusted in consideration of their intended use. A power via, which is used to supply a power voltage, may be provided to have a width larger than a signal via, which is provided for input/output of an electrical signal, and a bottom surface level of the power via may be lower than a bottom surface level of the signal via. Thus, the vias may be configured to have structures that are respectively designed (or, alternatively, optimized) for their intended use, and to have reduced electric resistance. In addition, since the signal via, which is provided adjacent to an integrated circuit, has a reduced width, it may be possible to prevent the integrated circuit from being damaged. Thus, it may be possible to provide a semiconductor device with improved electric characteristics.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate including a first surface and a second surface opposite the first surface;
   an insulating layer on the first surface of the substrate;
   a first via structure and a second via structure each penetrating the substrate and a portion of the insulating layer, the second via structure having a different width from the first via structure in a direction parallel to the first surface of the substrate with a bottom surface of the first via structure being at a level lower than a bottom surface of the second via structure, when measured from the first surface of the substrate;
   metal lines in the insulating layer, the metal lines configured to connect at least one of the first and second via structures to a lower semiconductor chip on the first surface of the substrate; and
   an integrated circuit on the first surface of the substrate, the integrated circuit being electrically connected to the second via structure through the metal lines.

2. The semiconductor device of claim 1, wherein a smallest width of the first via structure in the direction parallel to the first surface of the substrate is larger than a smallest width of the second via structure in the direction parallel to the first surface of the substrate.

3. The semiconductor device of claim 2, wherein the smallest width of the first via structure is 1.1 to 2 times the smallest width of the second via structure in the direction parallel to the first surface of the substrate.

4. The semiconductor device of claim 2, wherein
   the smallest width of the first via structure ranges from 0.2 µm to 10 µm, and
   the smallest width of the second via structure ranges from 0.1 µm to 5 µm.

5. The semiconductor device of claim 1, wherein a vertical distance between the bottom surface of the first via structure and the bottom surface of the second via structures ranges from 0.1 µm to 10 µm.

6. The semiconductor device of claim 1, wherein a height of the second via structure in a direction perpendicular to the first surface of the substrate is 80% to 99% a height of the first via structure in the direction perpendicular to the first surface of the substrate.

7. The semiconductor device of claim 1, further comprising:
   a plurality of lower pads configured to contact the bottom surface of respective ones of the first via structure and the second via structure.

8. The semiconductor device of claim 7, wherein at least one of the first via structure and the second via structure comprises:
   an insulating pattern;
   a barrier pattern on the insulating pattern; and
   a via on the barrier pattern such that the barrier pattern is interposed between a bottom surface of the via and a corresponding one of the plurality of lower pads.

9. The semiconductor device of claim 1, wherein each of the first via structure and the second via structure comprises:
   an insulating pattern;
   a barrier pattern on the insulating pattern such that the insulating pattern is interposed between the substrate and an outer side surface of the barrier pattern and between the insulating layer and the outer side surface of the barrier pattern; and
   a via on the barrier pattern such that the barrier pattern is interposed between an inner side surface of the insulating pattern and an outer side surface of the via.

10. The semiconductor device of claim 1, further comprising:
    a third via structure penetrating the insulating layer and the substrate.

11. The semiconductor device of claim 10, further comprising:
    the lower semiconductor chip provided on the first surface of the substrate and on a bottom surface of the insulating layer, the lower semiconductor chip being electrically connected to the third via structure.

12. The semiconductor device of claim 1, further comprising:
    the lower semiconductor chip on the first surface of the substrate and on a bottom surface of the insulating layer, the lower semiconductor chip having chip pads on a top surface thereof, the chip pads electrically connected to at least one of the first and second via structures.

13. The semiconductor device of claim 1, further comprising:
    a first upper pad and a second upper pad on the second surface of the substrate with the first upper pad spaced apart from the second upper pad in a direction parallel to the first surface of the substrate, the first upper pad and the second upper pad being electrically connected to the first via structure and the second via structure, respectively.

14. A semiconductor device, comprising:
a substrate including a first surface and a second surface opposite the first surface;
an insulating layer on the first surface of the substrate;
a first via structure and a second via structure each penetrating the substrate and a portion of the insulating layer, the first via structure and the second via structure each including an insulating pattern, a barrier pattern on the insulating pattern, and a via on the barrier pattern, a bottom surface of the first via structure being at a level lower than a bottom surface of the second via structure, when measured from the first surface of the substrate; and
a plurality of lower pads configured to contact the bottom surface of respective ones of the first via structure and the second via structure such that the barrier pattern is interposed between a bottom surface of the via in each of the first via structure and the second via structure and a corresponding one of the plurality of lower pads,
wherein at least one of the plurality of lower pads is configured to electrically connect the respective ones of the first via structure and the second via structure to a lower semiconductor chip on the first surface of the substrate, and
wherein a smallest width of the first via structure in a direction parallel to the first surface of the substrate is larger than that of the second via structure.

15. The semiconductor device of claim 14, further comprising:
a first upper pad and a second upper pad on the second surface of the substrate with the first upper pad spaced apart from the second upper pad in a direction parallel to the first surface of the substrate, the first upper pad and the second upper pad being electrically connected to the first via structure and the second via structure, respectively.

16. The semiconductor device of claim 14, further comprising:
an integrated circuit on the first surface of the substrate, the integrated circuit being electrically connected to the second via structure through metal lines in the insulating layer.

17. A semiconductor device, comprising:
a substrate including a first surface and a second surface opposite the first surface;
an insulating layer on the first surface of the substrate;
a first upper pad and a second upper pad on the second surface of the substrate with the first upper pad spaced apart from the second upper pad in a direction parallel to the first surface of the substrate; and
a first via structure and a second via structure each penetrating the substrate and a portion of the insulating layer, the second via structure having a different width from the first via structure in a direction parallel to the first surface of the substrate with a bottom surface of the first via structure being at a different level from a bottom surface of the second via structure, when measured from the first surface of the substrate, the first via structure and the second via structure being electrically connected to the first upper pad and the second upper pad, respectively.

18. The semiconductor device of claim 17, wherein
a smallest width of the first via structure in the direction parallel to the first surface of the substrate is larger than a smallest width of the second via structure in the direction parallel to the first surface of the substrate, and
the bottom surface of the first via structure is located at a level lower than the bottom surface of the second via structure, when measured from the first surface of the substrate.

19. The semiconductor device of claim 17, further comprising:
a plurality of lower pads configured to contact the bottom surface of respective ones of the first via structure and the second via structure,
wherein at least one of the first via structure and the second via structure includes an insulating pattern, a barrier pattern on the insulating pattern, and a via on the barrier pattern such that the barrier pattern is interposed between a bottom surface of the via and a corresponding one of the plurality of lower pads.

20. The semiconductor device of claim 17, wherein each of the first via structure and the second via structure comprises:
an insulating pattern;
a barrier pattern on the insulating pattern such that the insulating pattern is interposed between the substrate and an outer side surface of the barrier pattern and between the insulating layer and the outer side surface of the barrier pattern; and
a via on the barrier pattern such that the barrier pattern is interposed between an inner side surface of the insulating pattern and an outer side surface of the via.

* * * * *